US012587777B2

(12) United States Patent (10) Patent No.: US 12,587,777 B2

Baird (45) Date of Patent: Mar. 24, 2026

(54) LOUDSPEAKER APPARATUS, LOUDSPEAKER SYSTEM, DISPLAY PANEL AND SYSTEMS THEREOF

(71) Applicant: Full Stack Acoustic Limited, London (GB)

(72) Inventor: Jason Baird, London (GB)

(73) Assignee: Full Stack Acoustic Limited, London (GB)

( * ) Notice: Subject to any disclaimer, the term of this patent is extended or adjusted under 35 U.S.C. 154(b) by 251 days.

(21) Appl. No.: 18/021,117

(22) PCT Filed: Aug. 13, 2021

(86) PCT No.: PCT/GB2021/052106

§ 371 (c)(1),
(2) Date: Feb. 13, 2023

(87) PCT Pub. No.: WO2022/034340

PCT Pub. Date: Feb. 17, 2022

(65) Prior Publication Data

US 2023/0319459 A1 Oct. 5, 2023

(30) Foreign Application Priority Data

Aug. 13, 2020 (GB) ..................................... 2012680

(51) Int. Cl.
*H04R 1/24* (2006.01)
*H04R 3/14* (2006.01)
(Continued)

(52) U.S. Cl.
CPC ................. *H04R 1/24* (2013.01); *H04R 3/14* (2013.01); *H04R 17/00* (2013.01); *H04R 2430/20* (2013.01); *H10N 30/2042* (2023.02)

(58) Field of Classification Search
CPC . H04R 1/24; H04R 3/14; H04R 17/00; H04R 2430/20; H10N 30/2042
See application file for complete search history.

(56) References Cited

U.S. PATENT DOCUMENTS 2,453,521 A 11/1948 Marquis
2,922,851 A 1/1960 Manley
(Continued)

FOREIGN PATENT DOCUMENTS

EP 0095876 A2 12/1983
EP 0147992 A2 7/1985
(Continued)

OTHER PUBLICATIONS

Berkhout, et al., "Acoustic Holography for Sound Control," Presented at the 86th Convention an Audio Engineering Society Preprint 2801 (F-3): 1-9 (1989).
(Continued)

*Primary Examiner* — Carolyn R Edwards
*Assistant Examiner* — Dylan Maguire Neece
(74) *Attorney, Agent, or Firm* — Morse, Barnes-Brown & Pendleton, P.C.; Sean D. Detweiler, Esq.

(57) ABSTRACT

There is provided a loudspeaker apparatus having: a first unit arranged to propagate sound in a first frequency range; and a second unit arranged to propagate sound in a second frequency range that is higher than the first frequency range. The first unit includes a sound-radiating member and the second unit is mounted to the sound-radiating member of the first unit. The first unit and the second unit are driven by separate audio channels and/or the sound-radiating member of the first unit is planar.

20 Claims, 17 Drawing Sheets

(51) Int. Cl.
  H04R 17/00     (2006.01)
  H10N 30/20     (2023.01)

(56)                References Cited

U.S. PATENT DOCUMENTS

| | | | |
|---|---|---|---|
| 4,497,981 A | 2/1985 | House | |
| 4,554,414 A | 11/1985 | House | |
| 6,031,926 A | 2/2000 | Azima et al. | |
| 6,188,775 B1 | 2/2001 | Azima et al. | |
| 7,292,702 B2 * | 11/2007 | Hagman | H04R 7/045 |
| | | | 381/345 |
| 2005/0271230 A1 | 12/2005 | Sasaki | |
| 2007/0263888 A1 * | 11/2007 | Melanson | H04S 3/00 |
| | | | 381/300 |
| 2016/0150318 A1 * | 5/2016 | Donarski | H04R 1/24 |
| | | | 381/104 |
| 2017/0295423 A1 | 10/2017 | Tagami et al. | |
| 2018/0167722 A1 * | 6/2018 | Christner | H04R 27/00 |
| 2019/0306631 A1 | 10/2019 | Enenkl et al. | |
| 2019/0394546 A1 | 12/2019 | Chapman et al. | |
| 2020/0196067 A1 * | 6/2020 | Rusconi Clerici Beltrami | |
| | | | H04R 1/24 |

FOREIGN PATENT DOCUMENTS

| | | | |
|---|---|---|---|
| EP | 0847670 B1 | 3/1999 | |
| GB | 787424 A | 12/1957 | |
| GB | 830351 A | 3/1960 | |
| GB | 2262861 A | 6/1993 | |
| JP | S499227 U | 1/1974 | |
| JP | 8606398 U | 1/1985 | |
| JP | 2000078691 A | 3/2000 | |
| KR | 20110054972 A | 5/2011 | |
| KR | 102060287 B1 | 12/2019 | |
| WO | 9709846 A1 | 3/1997 | |
| WO | 2007/077438 A1 | 7/2007 | |

OTHER PUBLICATIONS

Berkhout, et al., "Wave Front Synthesis: A New Direction in Electro-Acoustics," Presented at the 93rd Convention an Audio Engineering Socienty Preprint 3379 (F-2): 1-27 (1992).

Bruijn, et al., "Subjective Experiments on the Effects of Combining Spatialized Audio and 2D Video Projection in Audio-visual Systems," Audio Engineering Society Convention Paper 5582: 1-11 (2002).

De Vries, et al, "The Wave Field Synthesis Concept Applied to Sound Reinforcement: Restrictions and Solutions," Presented at the 96th Convention an Audio Engineering Society Preprint, 3812 (P6.3): 1-18 (1994).

Mauer, et al., "A Reference Class Loudspeaker Panel for Wave Field Synthesis," Audio Engineering Society Convention Paper 8354: 1-12 (2011).

Melchior, et al., "Wave Field Synthesis in Combination with 2D Video Projection," AES International Conference on Multichannel Audio: 1-11 (no date given).

International Search Report from International Application No. PCT/GB2021/052106, date mailed: Jan. 26, 2022.

* cited by examiner

400

406

404

402

408

500

200

500

704

CPU 1002

Communication interface 1004

1014

Memory 1006

Storage 1008

User interface 1012

1016

Removable storage 1010

LOUDSPEAKER APPARATUS, LOUDSPEAKER SYSTEM, DISPLAY PANEL AND SYSTEMS THEREOF

RELATED APPLICATIONS

This application is a national stage filing under 37 U.S.C. 371 of International Application No. PCT/GB2021/052106, filed Aug. 13, 2021, which claims priority to Great Britain Patent Application No. GB 2012680.1, filed Aug. 13, 2020. The entire teachings of said applications are incorporated herein by reference herein. International Application PCT/GB2021/052106 was published under PCT Article 21(2) in English.

FIELD OF THE INVENTION

The present invention relates to a loudspeaker apparatus and in particular a loudspeaker apparatus suitable for application in Wave Field Synthesis methods. The invention also extends to a loudspeaker system including a plurality of loudspeaker apparatuses, a display panel for a loudspeaker apparatus, a display system including a plurality of display panels, a loudspeaker and display system, and related methods, in particular methods and systems for the display of moving video images with a means of co-locating the accompanying sound field relating to said images, in particular by use of the loudspeaker apparatus and the Wave Field Synthesis technique.

BACKGROUND TO THE DISCLOSURE

In order to deliver high quality audio reproduction to an audience, loudspeakers are typically designed and arranged to provide stereo or, more recently "immersive" audio, with the aim of creating as realistic as possible rendering of the original sound field.

However, two-channel stereo and many existing "immersive" loudspeaker systems (such as Dolby Digital® which features 5.1 channels, left, centre, right, left surround, right surround, with the 0.1 being the low frequency effects channel) utilise amplitude (signal level) panning between channels and in some embodiments psychoacoustic effects to achieve this aim and render a sound field with a "sweet spot" location (an area of the audience where the sound field is rendered most accurately) and reduced quality sound field rendering at other locations away from the "sweet spot".

An alternative approach for reproducing audio is Wave Field Synthesis (WFS) which aims to accurately recreate the original sound field in its entirety and not rely on psycho-acoustic effects. This approach aims to provide the benefit of having no "sweet spot", with a listener at any position within the coverage of the loudspeaker array being able to accurately perceive the location of the individual sound sources in the rendered sound field.

However, the implementation of Wave Field Synthesis is difficult with existing loudspeakers. In particular, existing loudspeakers are typically able to implement Wave Field Synthesis over only a limited frequency range.

It is an aim of the present invention to at least partially mitigate the problems outlined above.

SUMMARY OF THE INVENTION

Aspects and embodiments of the present invention are set out in the accompanying claims. These and other aspects and embodiments of the invention are also described herein.

In an aspect, there is provided a loudspeaker apparatus comprising: a first unit arranged to propagate sound in a first frequency range; and a second unit arranged to propagate sound in a second frequency range that is higher than the first frequency range; wherein the first unit comprises a sound-radiating member (such as a membrane, cone, diaphragm, or the like) and the second unit is preferably mounted to the sound-radiating member of the first unit; and preferably wherein the first unit and the second unit are driven by separate audio channels and/or the sound-radiating member of the first unit is planar.

The loudspeaker apparatus which comprises a second (high(er) frequency) unit mounted to the sound-radiating member of a first (low(er) frequency) unit may provide a coincident source of sound in two (potentially overlapping) frequency ranges (the first and second ranges; typically low and high frequency ranges). Driving the first and second units via separate audio channels may improve the versatility of the loudspeaker apparatus in that it allows providing different inputs to the first and second units (e.g. providing entirely different soundtracks to each unit, or applying various amounts of time delay to the inputs to each unit), and it may make the apparatus particularly well suited to more complex sound synthesising techniques such as Wave Field Synthesis (WFS). The (downstream surface of the) sound-radiating member of the first unit being planar (as opposed to e.g. a cone) may improve the directionality of the sound in the first frequency range, and it may enable improved alignment of the downstream axes of the first and second units (the second unit being mounted on the planar sound-radiating member of the first unit which is typically arranged perpendicularly to the downstream axis of the first unit). Further, the first (and preferably second) unit having a planar sound-radiating member may reduce phasing problems (such as interference and distortion) when a plurality of loudspeaker apparatuses propagate sound at the same time.

The first unit is preferably a low/mid-frequency unit. The second unit is preferably a high-frequency unit.

The apparatus preferably does not comprise a crossover assembly for separating an input signal into the first and second frequency ranges, which may be performed in the digital domain instead and the appropriate inputs may be fed in via the audio channels (audio signals).

The sound-radiating member of the first unit may comprise an aperture for mounting the second unit therein. The second unit is preferably mounted to the perimeter of the aperture, and the second unit preferably forms part of the sound-radiating member of the first unit. Preferably, in addition to propagating sound in the second frequency range, the second unit radiates in unison with the first unit thereby propagating sound in the first frequency range. Mounting the second unit in an aperture in the sound-radiating member of the first unit may allow the loudspeaker apparatus to have a substantially flat (planar) downstream surface; and it may reduce the mass of the moving parts of the first unit, which may improve the efficiency of the first unit and sensitivity in the first (low) frequency range.

Each audio channel may be an amplifier and signal processing channel (in other words, each audio channel may comprise amplification and signal processing information).

The apparatus may be adapted to apply time delay to one or more of the audio channels.

The second unit may comprise a piezoelectric element arranged to propagate sound in the second frequency range; preferably wherein the second unit comprises a plurality of piezoelectric elements arranged to form a piezoelectric bimorph. The piezoelectric element(s) may be a piezoelectric transducer. Using piezoelectric element(s) may reduce the mass of the second unit.

The second unit may comprise a sound-radiating member. The sound-radiating member of the second unit may be planar. Providing a planar sound-radiating member for the second unit may reduce phasing problems (such as interference and distortion) when a plurality of loudspeaker apparatuses propagate sound at the same time. Further, it may allow and/or simplify arranging, preferably tessellating, a plurality of loudspeaker apparatuses into an array.

The sound-radiating member of the second unit may be positioned/arranged downstream of the sound-radiating member of the first unit. Preferably, the sound-radiating member of the second unit is positioned/arranged downstream of the entire sound-radiating member of the first unit. Arranging the sound-radiating member of the second unit downstream of the sound-radiating member of the first unit may reduce distortion in the sound propagated in the first frequency range (i.e. by the first unit). This arrangement may reduce interference of the second frequency sound waves with the radiation of the first sound-radiating member. Further, this arrangement may simplify construction of the loudspeaker apparatus, in that the second unit can be arranged effectively downstream of the first unit such that each unit can be constructed/customised independently (e.g. an enclosure provided for the first unit) without affecting the construction of the other unit.

The sound-radiating member of the second unit may comprise a, preferably planar, primary sound-radiating member arranged to deflect in use, and a secondary, preferably larger and optionally planar, sound-radiating member attached to the primary sound-radiating member at its maximal deflection point. Providing a secondary, preferably larger, sound-radiating member may increase the mechanical coupling of the deflection of the primary sound-radiating member to the medium (typically air), thereby increasing the transduction efficiency of electrical energy to acoustic waves of the second unit.

Preferably, the primary sound-radiating member is, at least substantially, planar.

Preferably, the sound-radiating member of the second unit is directly coupled to the sound-radiating member of the first unit, more preferably such that in addition to propagating sound in the second frequency range, the sound-radiating member of the second unit radiates in unison with the sound-radiating member of first unit thereby propagating sound in the first frequency range.

The primary sound-radiating member may comprise piezoelectric element(s), preferably the piezoelectric element(s) as described herein, more preferably the piezoelectric bimorph as described herein. The mass of the secondary sound-radiating member is preferably less than 1 gram, more preferably less than 0.2 grams.

Preferably, the (downstream surfaces of the) sound-radiating members of the first and second unit(s) are arranged substantially parallel to one another.

Preferably, the sound-radiating member of the second unit is distinct to the sound-radiating member of the first unit.

Preferably, the actuator of a sound-radiating member of the first (and/or the second) unit and the sound-radiating member itself are arranged concentrically (i.e. they share the same centre, preferably in a plane perpendicular to the downstream axis). As used herein, the term "actuator" preferably refers to a component of the unit that actuates the sound-radiating member (i.e. causes it to vibrate to propagate sound), more preferably a component directly coupled to the sound-radiating member—e.g. a coil former of a moving coil (first) unit, or a piezoelectric element of a piezoelectric (second) unit. Arranging the actuator and sound-radiating member concentrically may improve the directionality of the propagated sound and reduce excitation of bending waves in the sound-radiating member.

Preferably, the sound-radiating member of the first unit and/or (each) second unit is substantially planar. Preferably, at least one of the primary and secondary sound-radiating members (that comprise the sound-radiating member of the second unit) is substantially planar, more preferably at least the primary sound-radiating member is substantially planar.

As used herein, the term "substantially planar" preferably connotes a surface for which, preferably at rest (i.e. when not emitting sound), an angle between (a) a normal line (i.e. a line perpendicular to a tangent line) at a centre point of the surface and (b) a normal line at any other point on the surface is less than 20°, more preferably less than 10°, yet more preferably less than 5°, yet more preferably less than 3°.

Preferably, the sound-radiating member of the first unit and/or (each) second unit is sufficiently planar so that the sound propagated by the unit has a high directionality.

The downstream axis of the second unit may be substantially parallel to the downstream axis of the first unit. In other words, the second unit may be arranged to output sound in the same direction as the first unit.

The term "substantially parallel" as used herein in relation to lines/axes preferably connotes that, preferably when projected onto a plane defined by the lines, the lines are at an angle of at most 20°, more preferably at most 10°, yet more preferably at most 5°, yet more preferably at most 3° to one another.

The term "substantially parallel" as used herein in relation to planes/surfaces (e.g. surfaces of the sound-radiating members) preferably connotes that the normal lines of the planes are at an angle of at most 20°, more preferably at most 10°, yet more preferably at most 5°, yet more preferably at most 3° to one another. The loudspeaker apparatus may comprise a plurality of second units mounted to the sound-radiating member of the first unit, wherein the first unit and each second unit are preferably driven by separate audio channels. Preferably, the plurality of second units comprises between 2 and 16 second units, more preferably between 2 and 9 second units, yet more preferably between 4 and 9 second units. Providing a plurality of second units on the sound-radiating member of the first unit may allow reducing the centre to centre spacing between (high-frequency) second units, thereby increasing the high-frequency bandwidth cut-off in various applications of the loudspeaker apparatus (such as WFS); without reducing the size (and thus compromising performance) of the (low-frequency) first unit.

The second units may be substantially uniformly distributed across the sound-radiating member of the first unit, and preferably across the downstream surface of the loudspeaker apparatus. The second units may be arranged symmetrically across the sound-radiating member of the first unit, preferably with at least two lines of symmetry. The centre points of the plurality of second units may define corners of one or more regular polygons. The second units may be arranged in a regular array.

Preferably, each second unit comprises a (distinct) sound-radiating member; more preferably each second unit actuates a distinct sound-radiating member to propagate sound.

The loudspeaker apparatus may comprise at least two pairs of adjacent second units, wherein the centre to centre spacing between a pair of adjacent second units is substantially the same for each adjacent pair.

The loudspeaker apparatus may comprise at least two pairs of second units adjacent along a first direction, wherein the centre to centre spacing between a pair of second units adjacent along the first direction is substantially the same for each pair adjacent along the first direction, wherein the first direction is preferably a horizontal direction. The loudspeaker apparatus may further comprise at least two pairs of second units adjacent along a second direction, perpendicular to the first direction, wherein the centre to centre spacing between a pair of second units adjacent along the second direction is substantially the same for each pair adjacent along the second direction, wherein the first direction is preferably a horizontal direction, and the second direction is preferably a vertical direction. This may make the loudspeaker apparatus particularly suitable for implementing Wave Field Synthesis in one or, preferably, two planes (e.g. a horizontal plane, or horizontal and vertical planes).

The centre to centre spacing between any pair of adjacent second units is preferably less or equal to 50 mm, and more preferably less or equal to 25 mm. This may ensure a sufficiently high high-frequency bandwidth cut-off when the loudspeaker apparatus is used for WFS that wide bandwidth sound fields (e.g. music) may be reproduced.

The sound-radiating members of the second units may substantially cover the (downstream surface of the) sound-radiating member of the first unit. Preferably, the sound-radiating members of the second units substantially cover the sound-radiating member of the first unit without overlapping. The loudspeaker apparatus may thereby provide a coincident sound source propagating sound in both the first and second frequency ranges. In other words, the sound-radiating members of the first and second units may provide a substantially continuous surface that acts as a coincident source of sound in both the first and second (low and high) frequency ranges.

Preferably, the sound-radiating members of the second units substantially cover the downstream surface of the loudspeaker apparatus.

As used herein, the term "substantially cover(s)" preferably refers to a coverage of at least 80%, more preferably at least 90%, yet more preferably at least 95%, yet more preferably at least 98% of a, preferably downstream, surface area.

The sound-radiating members of the second units may cover at least 90% of the downstream surface area of the sound-radiating member of the first unit, preferably at least 95%, more preferably at least 99%, yet more preferably 100%.

The summed downstream surface area of the sound-radiating members of the second units is preferably substantially the same as the downstream surface area of the sound-radiating member of the first unit.

Preferably, each sound-radiating member of a second unit has a tesselatable shape, more preferably an equiangular polygon shape, yet more preferably a regular polygon shape. Preferably, the sound-radiating members of the second units all have the same shape.

Preferably, the shape of each sound-radiating member of a second unit is tesselatable across the sound-radiating member of the first unit (and/or the downstream surface) of the loudspeaker apparatus and/or across the sound-radiating members of the first units (and/or the downstream surfaces) of a plurality of loudspeaker apparatuses when these are arranged in an array; more preferably across both. In other words, the sound-radiating members of the second units are preferably shaped such that, when a plurality of loudspeaker apparatuses are arranged adjacent one another (more preferably in an array), the sound-radiating members can be arranged in a tessellation.

For improved performance, the summed mass of the moving parts of the second units is preferably less or equal to the mass of the moving parts of the first unit; more preferably wherein the mass of the moving parts of each second unit is less than 5 grams, yet more preferably less than 3 grams.

Preferably, the downstream axis of each of the plurality of second units is substantially parallel to the downstream axis of the first unit. This may provide for improved directionality of the sound propagated by the units and improve the alignment of the sound propagated by the first unit and the sound propagated by the second units. The/each second unit may comprise a negative electrode. Preferably, the negative electrodes of the plurality of second units share a voltage supply, more preferably wherein the voltage supply is further used by the first unit.

The sound-radiating member of the first unit may substantially cover the downstream surface of the loudspeaker apparatus; preferably wherein the sound-radiating member of the first unit has a tesselatable shape, more preferably an equiangular polygon shape, yet more preferably a regular polygon shape. This may allow providing a substantially continuous (in particular, lacking gaps) sound-radiating surface when a plurality of loudspeaker apparatuses are arranged in an array.

In other words, the downstream surface of the loudspeaker apparatus may have a tesselatable shape. This may provide for loudspeakers apparatuses which can be arranged into arrays of loudspeaker units, to provide planar or line arrays of loudspeakers in which gaps between loudspeakers are minimised.

Preferably, the sound-radiating member of the first unit is substantially uniform/continuous, and preferably does not comprise gaps/apertures—such as a gap for a dust/centre cap in a conventional dynamic moving coil loudspeaker. Preferably, the sound-radiating members of the second units provide a substantially uniform/continuous surface, and more preferably do not comprise gaps/apertures. This may allow providing a substantially continuous sound propagating downstream surface area for the loudspeaker apparatus (since it is may be substantially covered by sound-radiating member(s) that have no gaps within or between them).

The loudspeaker apparatus may further comprise an enclosure arranged at the upstream side of the first unit. Preferably, the enclosure is a sealed enclosure. Preferably, the ratio V/A between the volume enclosed by the enclosure V in litres and the downstream surface area of the sound-radiating member of the first unit A in $m^2$ is between 50 and 800, more preferably between 80 and 500, yet more preferably between 100 and 410. Preferably, the enclosure encloses a volume of between 0.25 and 4 litres.

The loudspeaker apparatus may further comprise a third unit arranged to propagate sound in a third frequency range that is higher than the second frequency range mounted to a sound-radiating member of the second unit. The first unit is preferably a low frequency unit, the second unit is preferably a mid-frequency unit, and the third unit is preferably a high-frequency unit.

The sound-radiating member of the first unit may have a square shape, preferably with a side length between 40 and 100 mm, more preferably between 40 and 60 mm, yet more preferably 50 mm. The plurality of second units may comprise one of: four second units mounted to the sound-radiating member of the first unit, wherein each sound-radiating member of a second unit has a square shape with a side length approximately half that of the sound-radiating member of the first unit; four second units mounted to the sound-radiating member of the first unit, wherein the sound-radiating members of the second unit each have an isosceles triangle shape whose vertices meet at, or near, the centre of the sound-radiating member of the first unit; nine second units mounted to the sound-radiating member of the first unit, wherein each sound-radiating member of a second unit has a square shape with a side length approximately a third of that of the sound-radiating member of the first unit; or two second units mounted to the sound-radiating member of the first unit, wherein each sound-radiating member of a second unit has an oblong shape with a length (or height) approximately half that of the sound-radiating member of the first unit, and a height (or length) approximately the same as that of the sound-radiating member of the first unit.

The first unit may comprise a moving coil transducer.

The first frequency range and the second frequency range may partially overlap.

The first frequency range may be up to 20 Hz-10 kHz, preferably up to 65 Hz-5 kHz.

The second frequency range may be up to 1 kHz-40 kHz, preferably up to 4 kHz-20 kHz.

Preferably, the second unit is at least partially positioned downstream of the sound-radiating member of the first unit (i.e. at least part of the second unit (e.g. its sound-radiating member) is positioned downstream of the sound-radiating member of the first unit).

In a further aspect, there is provided a loudspeaker system comprising a plurality of loudspeaker apparatuses as described herein arranged in an array.

In a further aspect, there is provided a loudspeaker system comprising a plurality of loudspeaker apparatuses arranged in an array, each apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit.

Arranging the loudspeaker apparatuses in an array may allow the implementation of various sound synthesising techniques, such as WFS.

The loudspeaker apparatuses may be arranged in one or more of: an at least two-dimensional array, preferably a planar (two-dimensional) array, more preferably an oblong array, yet more preferably a square array; a line, or in a plurality of lines connected at their ends; and/or in a curve, or in a plurality of curves connected at their ends. Arranging the loudspeaker apparatuses in an at least two-dimensional array may allow the implementation of sound synthesising techniques in multiple planes (e.g. in a horizontal plane and a vertical plane). Arranging the loudspeaker apparatuses in a line, or in a plurality of lines connected at their ends, may allow the implementation of sound synthesising techniques in a single plane (e.g. in a horizontal plane.

The downstream surface of the array of loudspeaker apparatuses is preferably substantially continuous, more preferably wherein the loudspeaker apparatuses are arranged in a tessellation.

The downstream surface of the array of loudspeaker apparatuses is preferably substantially covered by sound-radiating members of the first units, which are more preferably themselves substantially covered by sound-radiating members of the second units.

Preferably, the sound-radiating members of the first units are arranged in a tessellation; and/or the sound-radiating members of the second units are arranged in a tessellation. The system may further comprise a control module arranged to control the first and second units across the array in order to synthesise a sound field. The control module may control the first and second units via their audio channels, optionally by controlling amplification and signal processing.

The control module may be arranged to apply varying degrees of time delay to the (audio channels of the) first (and/or second) units across the array in order to synthesise a sound wavefront in the first (and/or second) frequency range. In other words, the control module may actuate the first (or second) units across the array at different times.

The sound wavefront may have a virtual source, wherein the location of the virtual source is perceivable at a plurality of locations downstream of the loudspeaker apparatuses. In other words, the control module may be arranged to apply varying degrees of time delay to the first (and/or) second units to synthesise a sound wavefront with a virtual source, wherein the location of the virtual source is perceivable at a plurality of locations downstream of the loudspeaker apparatuses. The virtual source may be located upstream of one or more (preferably all) of the loudspeaker apparatuses.

The control module may be arranged to apply no time delay to a central first (or second) unit positioned at the centre of the, preferably linear, array, and to apply incrementally increasing time delay to first (or second) units positioned away from the central first (or second) unit to synthesise a wavefront and control its curvature via the increments in time delay between adjacent first (or second) units.

The control module may be arranged to apply no time delay to a central line of first (or second) units positioned at the centre of the, preferably planar, array, and to apply incrementally increasing time delay to lines of first (or second) units positioned away from the central line of first (or second) units to synthesise a wavefront and control its curvature via the increments in time delay between adjacent lines of first (or second) units.

The control module may be arranged to receive information related to the sound field, optionally from a capture module arranged to capture the sound field.

The system may further comprise a detection module arranged to detect, and optionally track, an object downstream of the loudspeaker system (i.e. downstream, including off-axis, of one or more of the plurality of loudspeaker apparatuses).

The control module may be arranged to: direct sound waves at the (detected) object; or to modify, preferably reduce, sound intensity at the location of the object in comparison to other downstream locations.

The system may comprise at least two pairs of adjacent first units; wherein the centre to centre spacing between a pair of adjacent first units is substantially the same for each adjacent pair across the array.

The system may comprise at least two pairs of adjacent second units; wherein the centre to centre spacing between a pair of adjacent second units is substantially the same for each adjacent pair across the array.

The system may comprise at least two pairs of second units adjacent along a first direction; wherein the centre to centre spacing between a pair of second units adjacent along the first direction is substantially the same for each pair adjacent along the first direction across the array; wherein the first direction is preferably a horizontal direction. The loudspeaker system may further comprise at least two pairs of second units adjacent along a second direction; wherein the centre to centre spacing between a pair of second units adjacent along the second direction, substantially perpendicular to the first direction, is substantially the same for each pair adjacent along the second direction across the array; wherein the first direction is preferably a horizontal direction, and the second direction is preferably a vertical direction.

The centre to centre spacing between any pair of adjacent second units across the array is preferably less or equal to 50 mm, more preferably less or equal to 25 mm. Accordingly, the array may be well suited to implementing WFS, and various other techniques, for wide bandwidth sound reproduction.

The sound-radiating member of each first unit may be supported by a suspension member arranged to prevent contact between sound-radiating members of adjacent loudspeaker apparatuses.

The system may further comprise a support module arranged to support at least a subset of the loudspeaker apparatuses, the support module comprising apertures for mounting loudspeaker apparatuses therein. Preferably, the support module comprises apertures for mounting an/the enclosure of each loudspeaker apparatus therein.

The system may comprise a plurality of support modules arranged to interlock with one another, each support module being arranged to support a subset of the plurality of loudspeaker apparatuses.

The system may be configured for implementing one or more of: wave field synthesis in one or more directions; an electronically adjustable dispersion pattern in one or more directions; and/or wave field synthesis in a first direction, and an electronically adjustable dispersion pattern in a second direction, preferably perpendicular to the first direction.

The system may be arranged to propagate sound at a stage venue, preferably at a concert hall or at a theatre; wherein the array of loudspeaker apparatuses is located nearby a stage, and its downstream surface faces an audience. The object tracked by the detection module as described herein may be a person or group of persons in the audience or on the stage, preferably a performing artist.

The system may be arranged to propagate sound at a video screening venue, preferably at a cinema; preferably wherein a display surface is arranged downstream of the array of loudspeaker apparatuses, Video content may be displayed at the video screening venue, preferably on the display surface; and the loudspeaker system may be arranged to propagate the video content's soundtrack.

In a further aspect, there is provided a display panel for the loudspeaker apparatus as described herein, comprising: a display surface for displaying visual information, the surface being acoustically porous; and a mounting member, extending from the display surface, configured for mounting the display surface to the loudspeaker apparatus.

Preferably, the mounting member is configured for mounting the display surface downstream of the loudspeaker apparatus.

Preferably, the display panel is planar.

In a further aspect, there is provided a display panel for a loudspeaker apparatus comprising: a display surface for displaying visual information, the surface being acoustically porous; and a mounting member, extending from the display surface, configured for mounting the display surface to the loudspeaker apparatus.

Providing an acoustically porous display surface and mounting it to a loudspeaker apparatus may improve the versatility of the display panel in that the display surface may be mounted downstream of the loudspeaker apparatus. Further, it may allow co-location of visual information and sound (which may pass via the acoustically porous display surface).

The display surface may be one of: a light emitting surface arranged to display visual information, preferably wherein the light emitting surface comprises a plurality of light sources, more preferably wherein the light sources are light emitting diodes; or a light reflecting surface arranged to display visual information projected thereon.

The display surface may comprise a plurality of acoustically porous elements (preferably apertures) and a plurality of display elements (preferably light sources, more preferably light emitting diodes) distributed substantially uniformly across the surface; preferably wherein the acoustically porous elements cover between 10% and 70% of the display screen, more preferably between 40% and 70% of the display screen, yet more preferably 50% of the display screen. Optionally, the acoustically porous elements and the display elements are arranged in one of: a chessboard pattern, interchanging lines of acoustically porous elements and display elements, or a combination thereof.

The display surface may be planar.

The mounting member may extend from an edge of the display surface.

The mounting member may be configured for mounting the display surface downstream of the loudspeaker apparatus, preferably substantially perpendicularly to the downstream axis of the loudspeaker apparatus. This may facilitate and improve co-location of sound (from the loudspeaker apparatus) and visual information (from the display surface).

For improved attachment of the display surface to the loudspeaker apparatus, the mounting member may comprise a female (or male) mating element configured to mate with a male (or female) mating element on the loudspeaker apparatus. The mounting member and loudspeaker apparatus mating elements may be arranged to maintain a spacing between the display surface and the loudspeaker apparatus in order to, preferably in use, prevent contact between a sound-radiating member of the loudspeaker apparatus and the display surface.

Preferably, in use, the mounting member is arranged away from the volume directly downstream of the loudspeaker apparatus, more preferably wherein the mounting member engages with the loudspeaker apparatus upstream of its sound-radiating member.

The mounting member may have an angled shape configured for mounting the display surface to two sides adjacent to a corner edge of the loudspeaker apparatus.

The mounting member may comprise an electrical supply for the display surface.

The display panel may comprise a plurality of mounting members, each member extending from the display surface and being configured for mounting the display surface to the loudspeaker apparatus, each mounting member preferably engaging with a different location on the loudspeaker apparatus.

In a further aspect, there is provided a display system comprising a plurality of display panels as described herein arranged in an array.

In a further aspect, there is provided a display system comprising a plurality of display panels for loudspeaker apparatuses arranged in an array, each display panel comprising: a display surface for displaying visual information, the surface being acoustically porous; and a mounting member, extending from the display surface, configured for mounting the display surface to the loudspeaker apparatus.

The display surfaces of the array of display panels may form a substantially continuous, and preferably planar, surface. The substantially continuous surface may form a display screen at a screening venue.

In a further aspect, there is provided a loudspeaker and display system comprising a loudspeaker apparatus and a display surface for displaying visual information arranged downstream of the loudspeaker apparatus, wherein the loudspeaker apparatus comprises: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit.

The display surface may be acoustically porous.

The system may further comprise a mounting member, extending from the display surface, configured for mounting the display surface downstream of the loudspeaker apparatus.

In a further aspect, there is provided a loudspeaker and display system comprising: a loudspeaker system as described herein; and a display surface for displaying visual information arranged downstream of the array of loudspeaker apparatuses (i.e. downstream of the loudspeaker system); optionally wherein the display surface is acoustically porous.

Preferably, the system is arranged to co-locate the propagated sound with the visual information; preferably wherein the system is arranged to synthesise a sound wavefront whose virtual source is co-located with an object on the display surface.

In a further aspect, there is provided a loudspeaker and display system comprising a plurality of loudspeaker apparatuses arranged in an array and a display surface for displaying visual information arranged downstream of the array, wherein each loudspeaker apparatus comprises: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit.

The system may be arranged to co-locate the propagated sound with the visual information. The system may be arranged to synthesise a sound wavefront whose virtual source is co-located with an object on the display screen/surface. The position of the virtual source, or of a projection from the virtual source to the display surface along the direction of the wavefront, may be substantially the same as the position of the object on the display screen. The horizontal position of the virtual source, or of a projection from the virtual source to the display surface along the direction of the wavefront, may be substantially the same as the horizontal position of the object on the display screen.

In a further aspect, there is provided a loudspeaker apparatus comprising a first unit arranged to propagate sound in a first frequency range and comprising a sound-radiating member; wherein the sound-radiating member of the first unit comprises an aperture for receiving a second unit arranged to propagate sound in a second frequency range that is higher than the first frequency range.

Th apparatus may further comprise a second unit arranged to propagate sound in a second frequency range that is higher than the first frequency range mounted in the aperture.

In a further aspect, there is provided a loudspeaker apparatus comprising: a first unit comprising a sound-radiating member and being arranged to propagate sound in a first frequency range; and a plurality of second units, each second unit comprising a sound-radiating member and being arranged to propagate sound in a second frequency range that is higher than the first frequency range; wherein the plurality of second units are mounted to the sound-radiating member of the first unit; and wherein the sound-radiating members of the second units substantially cover the (downstream surface of the) sound-radiating member of the first unit, preferably without overlapping.

In a further aspect, there is provided a loudspeaker apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit.

In a further aspect, there is provided a loudspeaker and display system comprising a loudspeaker apparatus and a display surface for displaying visual information mounted downstream of the loudspeaker apparatus; wherein the display surface is acoustically porous and comprises a plurality of light emitting diodes.

In a further aspect, there is provided a loudspeaker system comprising a plurality of loudspeaker apparatuses and display panels mounted thereto arranged in an array, each apparatus comprising: a first unit arranged to propagate sound in a first frequency range; and a second unit arranged to propagate sound in a second frequency range that is higher than the first frequency range, wherein the first unit comprises a sound-radiating member and the second unit is mounted to the sound-radiating member of the first unit; and each display panel comprising: a display surface for displaying visual information, the surface being acoustically porous; and a mounting member, extending from the display surface, configured for mounting the display surface downstream of the loudspeaker apparatus.

In a further aspect, there is provided a method of propagating sound comprising: providing a loudspeaker apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit; driving the first unit using a first audio channel; and driving the second unit using a second audio channel that is separate to the first audio channel; optionally wherein the sound-radiating member of the first unit is planar.

The method may further comprise: providing a display surface downstream of the loudspeaker apparatus; and displaying visual information on the display surface.

In a further aspect, there is provided a method of arranging a plurality of loudspeaker apparatuses in an array, comprising: providing the plurality of loudspeaker apparatuses, each loudspeaker apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit; arranging the plurality of loudspeaker apparatuses in an array, preferably minimising the empty space between adjacent loudspeaker apparatuses; and optionally, securing the position of the plurality of loudspeaker apparatuses relative to one another, preferably using a support module.

In a further aspect, there is provided a method of synthesising a sound field, comprising: providing an array of loudspeaker apparatuses, each loudspeaker apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit; and controlling the loudspeaker apparatuses to synthesise the sound field.

The step of controlling the loudspeaker apparatuses to synthesise a sound field may comprise applying varying degrees of time delay to sound outputs from the loudspeaker apparatuses across the array in order to synthesise a sound wavefront. The sound wavefront may have a virtual source; wherein the location of the virtual source is perceivable at a plurality of locations downstream of the loudspeaker apparatuses. The step of applying varying degrees of time delay to sound outputs from the loudspeaker apparatuses across the array in order to synthesise a sound wavefront may comprise: applying no time delay to one or more central first (or second) units positioned at, or near, the centre of the array of loudspeaker apparatuses; applying incrementally increasing time delay to first (or second) units positioned away from the one or more central first (or second) units in order to synthesise a wavefront; and optionally, controlling the curvature of the wavefront via the increments in time delay between adjacent first (or second) units In a further aspect, there is provided a method of mounting a display surface to a loudspeaker apparatus, comprising: providing the display surface, the surface being acoustically porous; and mounting the display surface to the loudspeaker apparatus using a mounting member extending from the display surface.

In a further aspect, there is provided a method of arranging a plurality of display panels in an array, comprising: providing the plurality of display panels, each display panel comprising: a display surface for displaying visual information, the surface being acoustically porous; and a mounting member, extending from the display surface, configured for mounting the display surface to the loudspeaker apparatus; and arranging the plurality of display panels in an array, preferably minimising the empty space between adjacent display surfaces.

In a further aspect, there is provided a method of co-locating sound and visual information, comprising: arranging a display surface downstream of a plurality of loudspeaker apparatuses, each loudspeaker apparatus comprising: a first unit arranged to propagate sound in a first frequency range; and a second unit arranged to propagate sound in a second frequency range that is higher than the first frequency range; wherein the first unit comprises a sound-radiating member and the second unit is mounted to the sound-radiating member of the first unit; and using the plurality of loudspeaker apparatuses, synthesising a sound wavefront whose virtual source is co-located with an object on the display screen/surface.

In a further aspect there is provided a kit of parts for a loudspeaker apparatus, comprising: a first unit arranged to propagate sound in a first frequency range; and a second unit arranged to propagate sound in a second frequency range that is higher than the first frequency range; wherein the first unit comprises a sound-radiating member and the second unit is adapted to be mounted to the sound-radiating member of the first unit; and wherein the first unit and the second unit are adapted to be driven by separate audio channels and/or the sound-radiating member of the first unit is planar.

In a further aspect there is provided a kit of parts for a loudspeaker system, comprising a plurality of kits of parts for loudspeaker apparatuses, each comprising: a first unit arranged to propagate sound in a first frequency range; and a second unit arranged to propagate sound in a second frequency range that is higher than the first frequency range; wherein the first unit comprises a sound-radiating member and the second unit is adapted to be mounted to the sound-radiating member of the first unit.

In a further aspect there is provided a kit of parts comprising: a display surface for displaying visual information, the surface being acoustically porous; and a mounting member, adapted to be mounted to and extend from the display surface, and adapted to mount the display surface to a loudspeaker apparatus.

In a further aspect there is provided a kit of parts comprising: a first unit arranged to propagate sound in a first frequency range; a second unit arranged to propagate sound in a second frequency range that is higher than the first frequency range; and a display surface for displaying visual information adapted to be arranged downstream of the first unit and of the second unit; wherein the first unit comprises a sound-radiating member and the second unit is adapted to be mounted to the sound-radiating member of the first unit.

To describe the aforementioned aspects in other words, in a further aspect, there is provided a loudspeaker drive unit (apparatus) which comprises a transducer element (first unit) operating over a first frequency range, via sound radiation from a surface able to vibrate over the first frequency range. Preferably, the loudspeaker drive unit comprises at least one, and preferably more, additional transducer elements (second units), operating over a second, higher frequency range and that these transducer elements are situated upon and form part of the radiating surface of the first transducer element, thus creating a loudspeaker drive unit operating over a first frequency and a second frequency range, where the transducer elements radiating over the second frequency range are coincident with the element radiating over the first frequency range.

For improved suitability to WFS applications, preferably, the low frequency and each of the high frequency transducer elements are able to be driven by individual signal processing and amplifier channels. Further, the sum of the projected sound radiating surface area of each of the transducer elements operating over the second frequency range is preferably substantially equal to the area of the surface radiating over the first frequency range. The surface of the element radiating over the first frequency range is also preferably substantially equal to the frontal (downstream) surface of the loudspeaker drive unit, thus creating a substantially continuous surface appearance over the whole of the frontal surface of a linear or planar array of such loudspeaker drive units.

The disclosure may thus provide the degrees of freedom to:

i. Optimise the design of the low frequency transducer, without the constraint of it having to also operate in a high frequency range.

ii. Optimise the design of the high frequency transducers, without the constraint of having to also operate in a low frequency range.

iii. Optimise the centre-to-centre spacing and number of high frequency transducers to yield a significantly higher high-frequency bandwidth cut-off than that of existing loudspeakers used for WFS.

iv. Optimise i. ii. and ii. whilst maintaining coincident radiation of sound waves between the low frequency and high frequency operating ranges of the resulting loudspeaker drive unit.

v. Produce loudspeaker arrays of arbitrary size by arranging each loudspeaker drive unit directly adjacent to its neighbours, whilst maintaining the centre-to-centre spacing of the high frequency transducers, in order to maintain the same high-frequency bandwidth cut-off, irrespective of array size.

vi. Produce loudspeaker arrays with the appearance of a substantially continuous frontal surface.

In a further aspect, the loudspeaker drive units are arranged into planar arrays, and a means of displaying a video image in close proximity to and coplanar with the resulting surface is provided. Preferably, this takes the form of an acoustically porous matrix of light emitting diodes (LED's), which are supported by one or more members which project through the planar array in such a way that the array's acoustically radiating surface and high-frequency cut-off figure are substantially unperturbed.

Alternatively, a video image may be projected on to the frontal surface of a planar array of loudspeaker drive units as described herein incorporating properties i to vi above.

In a further aspect, there is provided a loudspeaker apparatus comprising high frequency radiators (transducers) arranged such that the centre to centre spacing of the high frequency radiators yields an exceptionally high high-frequency bandwidth cut-off for WFS applications compared to the prior art, thus enabling more faithful reproduction of programme material such as music, song and motion picture soundtracks.

In a further aspect, the loudspeaker apparatus is arranged in to linear or planar arrays, whilst maintaining the same bandwidth in both the horizontal and vertical planes, thus enabling the WFS technique to operate over an increased high frequency range when compared to existing systems, irrespective of the size of the array.

In a further aspect, a combined audio-visual system is provided incorporating a means of displaying video (visual) information coplanar to that of a planar array of such loudspeakers. This may enable improved accuracy of sound source localisation, of wide bandwidth content such as music, to the video information displayed due to the present invention's ability to maintain a high high-frequency bandwidth cut-off in planar loudspeaker arrays of arbitrary size.

Further features of the invention are characterised by the dependent claims.

Each of the aspects above may comprise any one or more features mentioned in respect of the other aspects above.

The invention extends to any novel aspects or features described and/or illustrated herein. In addition, any apparatus feature as described herein may also be provided as a method feature, and vice versa. Furthermore, any, some and/or all features in one aspect can be applied to any, some and/or all features in any other aspect, in any appropriate combination.

The invention extends to methods and/or apparatus substantially as herein described and/or as illustrated with reference to the accompanying drawings.

The invention also provides a computer program and a computer program product for carrying out any of the methods described herein and/or for embodying any of the apparatus features described herein, and a computer readable medium having stored thereon a program for carrying out any of the methods described herein and/or for embodying any of the apparatus features described herein. The invention also provides a signal embodying a computer program for carrying out any of the methods described herein and/or for embodying any of the apparatus features described herein, a method of transmitting such a signal, and a computer product having an operating system which supports a computer program for carrying out any of the methods described herein and/or for embodying any of the apparatus features described herein.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

Furthermore, features implemented in hardware may generally be implemented in software, and vice versa. Any reference to software and hardware features herein should be construed accordingly.

In this specification the word 'or' can be interpreted in the exclusive or inclusive sense unless stated otherwise.

It should be noted that the term "comprising" as used in this document means "consisting at least in part of". So, when interpreting statements in this document that include the term "comprising", features other than that or those prefaced by the term may also be present. Related terms such as "comprise" and "comprises" are to be interpreted in the same manner. As used herein, "(s)" following a noun means the plural and/or singular forms of the noun.

As used herein, means plus function features may be expressed alternatively in terms of their corresponding structure, such as a suitably programmed processor and associated memory.

Preferred examples are now described, by way of example only, with reference to the accompanying drawings.

DETAILED DESCRIPTION OF PREFERRED EXAMPLES

The present disclosure is described with particular reference to Wave Field Synthesis, which serves as an example application of the present disclosure.

An important governing relation for WFS is the centre to centre spacing between each transducer emitting sound at the upper-end of the loudspeaker's frequency range (typically a dedicated high-frequency transducer, or, in the case of "full-range" loudspeakers, simply the transducer) which defines the upper limit frequency to which the WFS technique can operate, before spatial aliasing artefacts become present. Spatial aliasing refers to signals being present in the reproduced sound field, which were not part of the spatial distribution of the original signal. This upper limit frequency is termed $f_{alias}$ and is defined by equation (1) for a linear transducer array:

$$f_{alias} = \frac{c}{2\Delta x \sin(\alpha_{max})} \tag{1}$$

Where, c=speed of sound in metres per second (typically 344 m/s)

$\Delta x$=centre to centre spacing between each transducer (metres)

Figure 1:
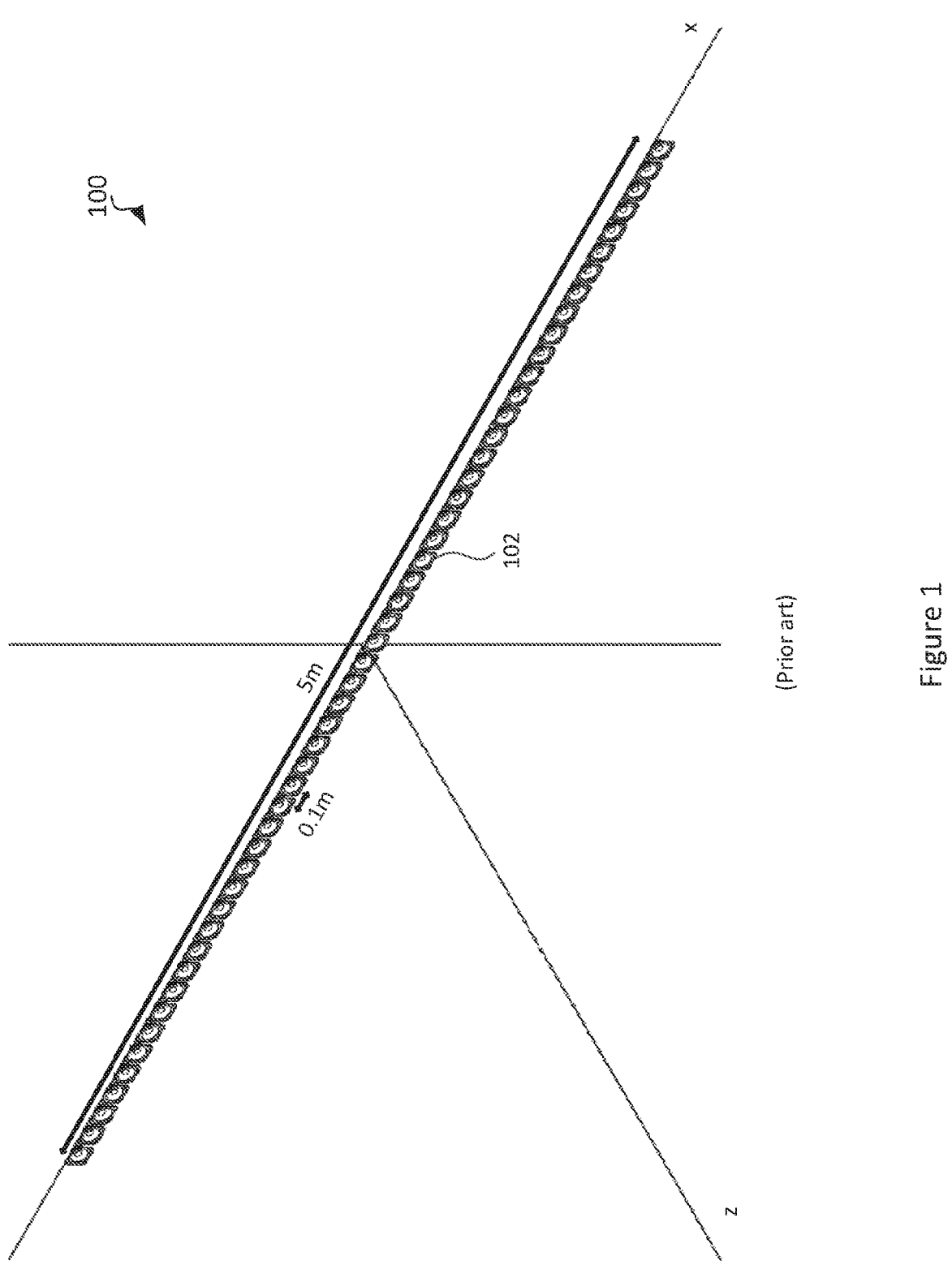
FIG. 1 shows a linear loudspeaker array as known in the prior art.

$\alpha_{max}$=maximum angle of incidence between the x axis (being the linear axis described by the transducer array shown in FIG. 1) and the plane wave components of the wave field being synthesised (z axis).

By inspection of the equation it can be seen that a smaller spacing between each transducer, yields a higher value of $f_{alias}$.

FIG. 1 shows an example prior art system that comprises full-range loudspeakers arranged in a linear array at a centre to centre spacing of 0.1 m. Hence, for an angle of incidence of 90° (sound waves perpendicular to the linear axis of the transducer array) $f_{alias}$ for the system of FIG. 1 is equal to 1.7 kHz. The resulting bandwidth is adequate for speech reproduction but falls short of the bandwidth required for faithful reproduction of music, song and sound effects, which can have significant spectral content above this frequency. In order to increase $f_{alias}$, the spacing between the loudspeakers would need to be reduced further. However, this may not be practical, as it would require a reduction in size of the transducers, which is limited by the displacement (the volume of air displaced by the transducer) needed to reach a desired sound pressure level at low frequencies (this displacement quadruples with each halving of the frequency). Accordingly, the prior art system of FIG. 1 is not suitable for many applications of WFS (such as the reproduction of music signals) due to the system's limited frequency range.

In contrast, the present disclosure is particularly well suited to the implementation of WFS. By mounting a high frequency transducer to the diaphragm of a low frequency transducer, the present disclosure provides a coincident and compact wide-bandwidth loudspeaker. Further, by mounting a plurality of such high frequency transducers and distributing them uniformly across the surface of the low frequency diaphragm, the centre to centre spacing between high frequency transducers is not limited by the size of the low frequency transducer, and both aspects (centre to centre spacing between high frequency transducers, and low frequency transducer size) can be optimised separately without a trade-off in performance of either.

The loudspeaker of the present disclosure may be well suited to the construction of arrays of the loudspeakers. For WFS to operate in three dimensions a planar array of transducers is required—thus, the present disclosure is described with particular reference to planar arrays. Notably, the relationship between transducer spacing and f defined in equation (1) above holds in both the horizontal and vertical planes for a planar array. Hence for a planar WFS array to exhibit the same $f_{alias}$ value in both the horizontal and vertical planes, the centre-to-centre spacing between each transducer must be the same in both planes.

However, the present disclosure is equally well suited to the implementation of WFS in only two dimensions using a linear array instead. Given that human hearing is better able to discriminate directional information in the horizontal plane, rather than the vertical, the linear WFS array would therefore preferably be arranged as a line of transducers extending along the horizontal axis.

In addition to WFS, the present disclosure could equally well be applied to any other audio rendering technique or system—in particular techniques that benefit from a small centre to centre spacing between high frequency transducers (such as electronic adjustment of dispersion pattens). Further, the present disclosure works particularly well for implementing a combined audio-visual system in which a display surface is mounted downstream of a planar array of loudspeakers which enables sound source localisation of the emitted sound in relation to a location on the display surface (e.g. in a cinema application, co-location of a character's face on the screen and the audio signal of their voice).

Thus, the present disclosure is particularly well suited for providing audio, and optionally video, content at performance events, such as live music, theatre, or cinema events.

Loudspeaker Apparatus

Figure 2:
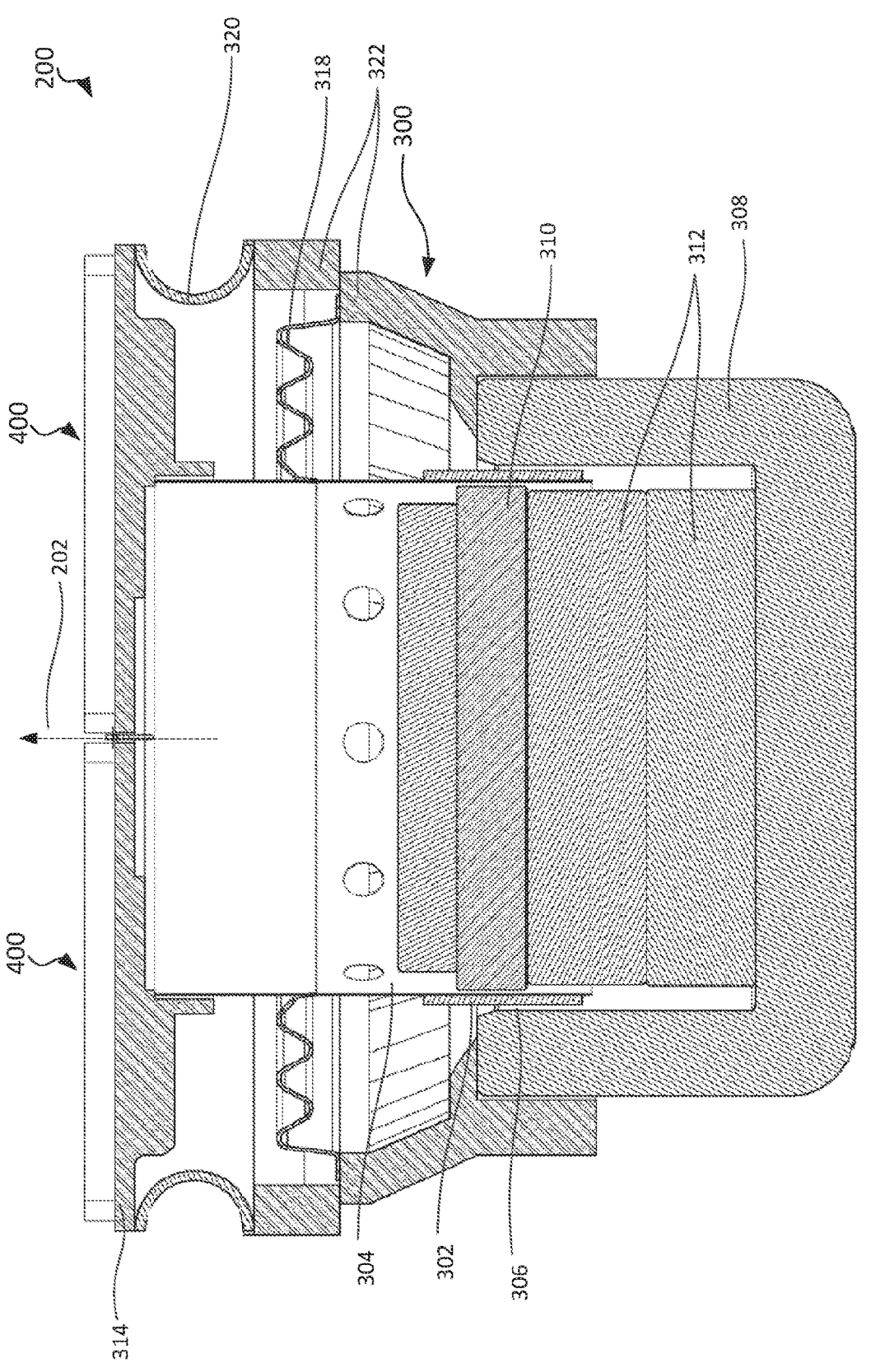
FIG. 2 shows a cross-section view of a loudspeaker apparatus.
Figure 3:
FIG. 3 shows a perspective view of the loudspeaker apparatus.
Figure 4:
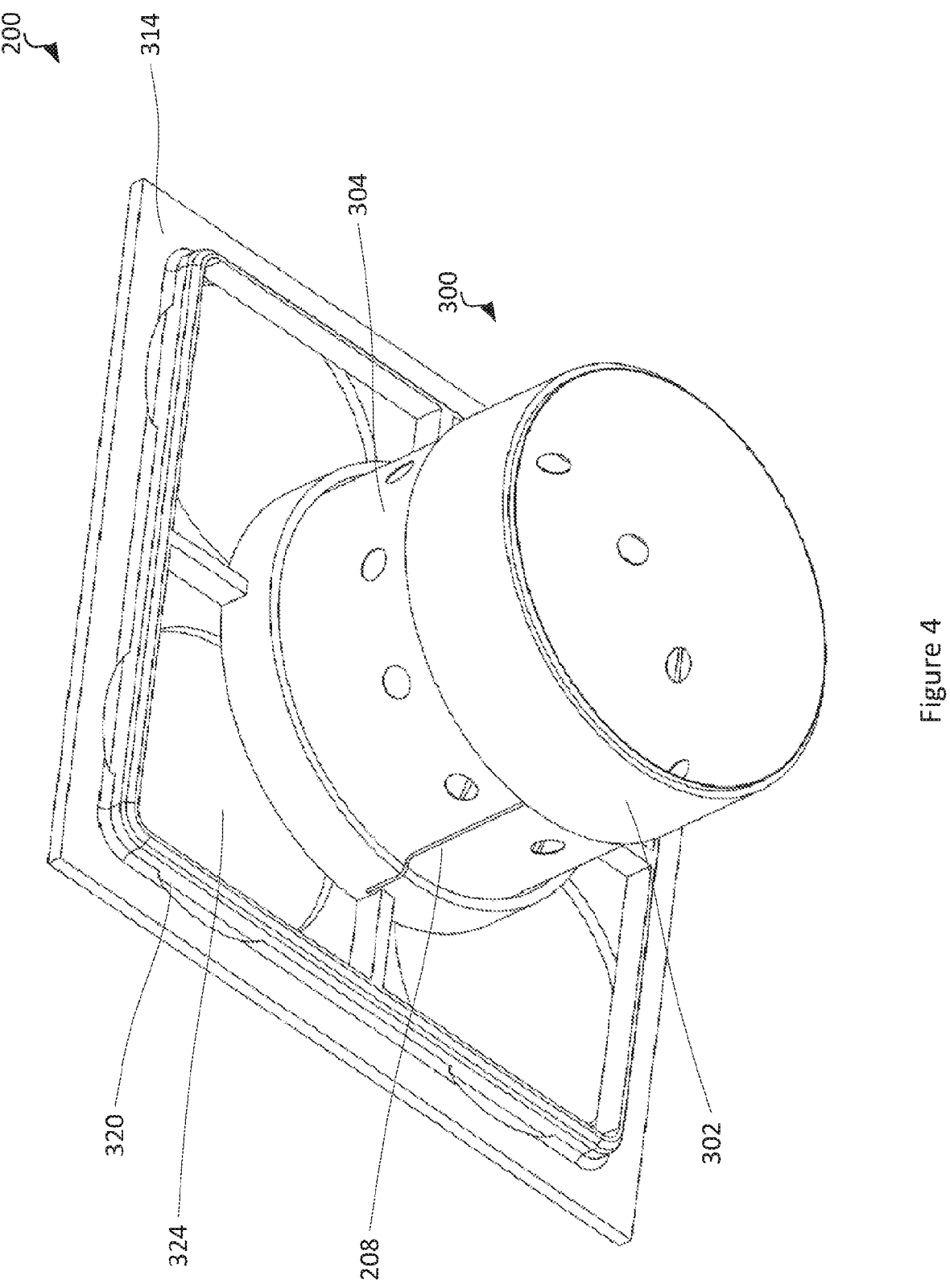
FIG. 4 shows a perspective view of the loudspeaker apparatus of FIG. 2 from beneath.

FIGS. 2 to 4 show various views of a loudspeaker apparatus 200.

FIG. 2 shows a cross-section view of the loudspeaker apparatus 200. The loudspeaker apparatus 200 comprises: a low frequency (first) unit in the form of a low frequency transducer 300, and one or more high frequency (second) units in the form of high frequency transducers 400 mounted to the low frequency transducer 300 (FIGS. 2-4 show an example arrangement comprising four high frequency units, two of which can be seen in FIG. 2). Accordingly, the loudspeaker apparatus 200 may act as a coincident and compact wide-bandwidth acoustic source.

A transducer 300, 400 is a physical means of transforming one form of energy into another. In this case electrical energy is transformed into kinetic, vibrational energy such that the electrical signal can be perceived as sound waves by a listener.

Preferably, the first unit (low frequency transducer) 300 and the second unit (high frequency transducer) 400 each comprise a sound-radiating (or sound-reproducing) member (such as a membrane, cone, diaphragm, or the like).

A principal acoustic downstream direction 202 is shown in FIG. 2. This term is used throughout preferably to refer to a direction in which sound propagates away from the front of the loudspeaker apparatus 200, wherein the axis of the downstream direction 202 is perpendicular to the preferably planar high and low frequency transducers. The terms "downstream direction" and "downstream" as used herein preferably refer to the intended projection direction of the sound propagated by the loudspeaker apparatus 200. The term "downstream" as used herein in relation to the loudspeaker apparatus as a whole (e.g. "downstream of the loudspeaker apparatus") preferably refers to points whose position component along the downstream direction (axis) 202 is greater than that of the component(s) of the loudspeaker apparatus 200. The term "upstream direction" as used herein preferably opposes the downstream direction 202. The term "off-axis" preferably refers to points that are not lying on the axis of the downstream direction 202.

In the present example, the low frequency transducer 300 employs the moving coil (electrodynamic transduction) principle in order to propagate sound in a lower (first) frequency range. In other words, the low frequency transducer 300 is a moving coil transducer. The low frequency transducer 300 comprises a coil of (preferably electrically-insulated) conductive wire (referred to herein as the voice coil 302) wound around a cylinder of sheet material (referred to herein as the coil former 304). The voice coil 302 is located in a narrow annular aperture (referred to herein as the magnetic gap 306).

The magnetic gap 306 is defined between two cylindrical parts 308, 310. The first cylindrical part 308 is substantially cup-shaped and encompasses the magnetic gap 306. Two cylindrical pieces of magnetic material 312 (such as neodymium-iron-boron) are located centrally within the first cylindrical part 308, one on top (downstream) of the other. The second cylindrical part 310 is disposed on top (downstream) of the magnetic parts 312. The magnetic parts 312 therefore separate the two cylindrical parts 308, 310 which define the magnetic gap 306. This arrangement creates a magnetic circuit, where an intense magnetic field exists in the magnetic gap 306.

Preferably, the coil former 304 is supported by a first (inner) suspension member 318. The first suspension member 318 is configured to retain the coil former 304 in the magnetic gap 306. The first suspension member 318 is attached at its periphery to a chassis member 322 which is itself disposed on the first cylindrical part 308 defining the magnetic gap 306.

The low frequency transducer 300 further comprises a sound-radiating member in the form of a diaphragm 314 coupled to the coil former 304. The diaphragm 314 is preferably planar. For example, the diaphragm 314 may comprise a moulded part forming a planar downstream surface as shown in FIG. 2.

The perimeter of the diaphragm 314 is preferably supported by a second (outer) suspension member 320. This second suspension member 320 connects the perimeter of the diaphragm 314 to the chassis member 322, in order to provide an air-tight seal between acoustic vibrational radiation from the front (downstream) and the rear (upstream) of the moving parts of the low frequency transducer 300 (wherein the "moving parts" preferably refers to the voice coil 302, the coil former 304, the first suspension member 318, the diaphragm 314 and the second suspension member 320). The second suspension member 320 is configured to deflect in such a way that when the moving parts of the first transducer 300 are vibrating, the second suspension member 320 does not extend outwards from the edges of the loudspeaker apparatus 200, in order not to come in to contact with adjacent vibrating (moving) parts when a number of loudspeaker apparatuses 200 are arranged close in close proximity to each other, for example, in planar or linear arrays (described in further detail below). For example, the second suspension member 320 may have a semi-circular profile bending in towards a central axis of the loudspeaker apparatus 200 (as shown in FIG. 2). Alternatively, the second suspension member 320 may have a concertina-like profile likewise bending in towards a central axis of the loudspeaker apparatus 200.

In use, a current flows through the voice coil 302 thereby creating a force perpendicular to the direction of the current and the direction of the magnetic field in the magnetic gap 306. This force acts to displace the voice coil 302 and all parts attached to it in a direction along the axial axis of the voice coil 302. Reversing the direction of current flow causes a force in an opposite direction to the first force, which causes the voice coil 302 (and the remaining moving parts) to move in the opposite direction. The motion of the voice coil 302 causes the diaphragm 314 to propagate sound waves.

The low frequency transducer 300 may operate over a frequency range of 20 Hz to 10 kHz, and preferably over a frequency range of 65 Hz to 5 kHz. By operating down to a frequency of 65 Hz, the low frequency transducer 300 may reproduce sufficiently low frequencies that the use of a separate subwoofer loudspeaker is not required. However, for use at concerts or for reproduction of motion picture sound tracks with content below 65 Hz, subwoofers may be used in addition to the loudspeaker apparatus 300.

The low frequency transducer's 300 bandwidth may be optimised using the mass of its moving parts. At the lower end of the operating band the fundamental resonant frequency of the moving parts of the transducer 300 creates a mechanical high pass filter. As the resonant frequency is inversely proportional to the square root of the mass of the moving parts of the transducer 300, the low frequency bandwidth can be extended by increasing the mass of the moving parts. At the same time, at the upper end of the operating band the mass of the moving parts of the transducer also becomes a significant factor. This mass manifests as a mechanical low pass filter, which reduces the radiation efficiency at the upper end of the frequency band. Thus, there exists a trade-off between optimising for the high and low ends of the operating frequency band, and the mass of the moving parts of the low frequency transducer 300 may be optimised depending on the specific application of the loudspeaker apparatus 200.

Figure 10:
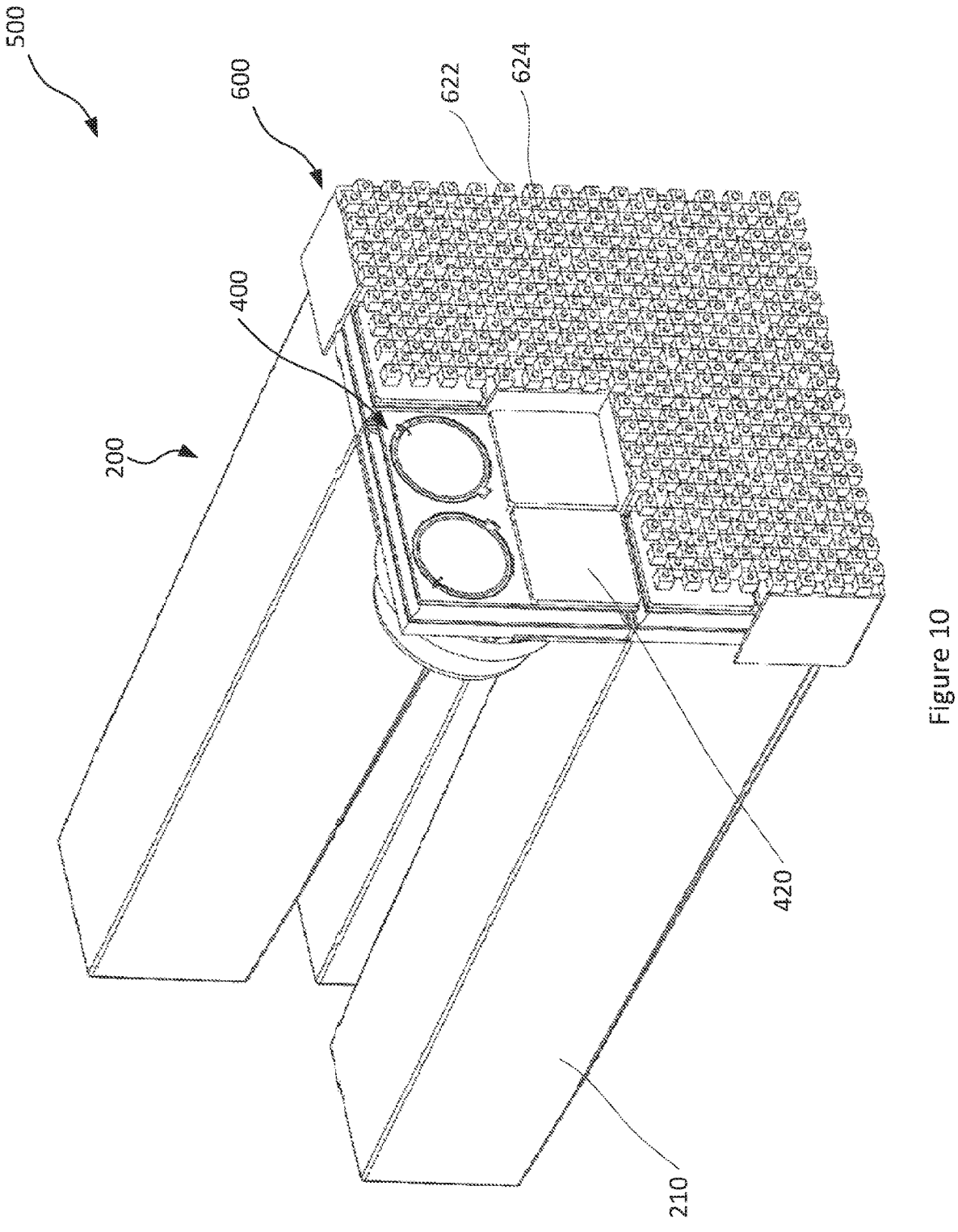
FIG. 10 shows the loudspeaker system and display panels mounted thereto.

For improved performance, the loudspeaker apparatus 200 may further comprise an enclosure 210 (shown e.g. in FIG. 10). As shown in FIG. 10, the enclosure is preferably a sealed (box) enclosure. The enclosure 210 prevents sound waves generated by the upstream surfaces of the low and high frequency diaphragms from interacting with sound waves generated at the downstream surface. The size of the enclosure is closely related to the size of the transducer 300 and its components. The volume of a medium (typically air) within the enclosure 210 acts to raise the fundamental resonant frequency of the transducer 300, in a manner inversely proportional to the square root of the said air volume. This property also forms part of the optimisation of the mass of the moving parts of the low frequency transducer 300. The volume enclosed by the enclosure 210 is preferably directly proportional to the radiating surface area of the low frequency transducer 300 (i.e. to the downstream surface area of the low frequency diaphragm 314). Preferably, the ratio V/A between the volume enclosed by the enclosure 210 (V) in litres and the downstream surface area of the low frequency transducer 300 diaphragm 314 (A) in $m^2$ is between 50 and 800, more preferably between 80 and 500, yet more preferably between 100 and 410. For example, for loudspeaker apparatuses 200 as described herein with a diaphragm 314 with (a square shape) and downstream surface dimensions of: (i) 0.05 m×0.05 m, (ii) 0.075 m×0.075 m, or (iii) 0.1 m×0.1 m, the enclosure 210 may enclose between: (i) 0.25 and 1 litres (and/or be of a depth of 0.1 to 0.4 m), (ii) 0.6 and 2.3 litres, or (iii) 1 and 4 litres respectively.

Preferably, the surface area of the enclosure 210 in the plane perpendicular to the downstream axis 202 is lesser or equal to the surface area of the downstream surface of the loudspeaker apparatus 200, such that a plurality of loud-speaker apparatuses 200 may be arranged in an array 500 with a substantially continuous downstream surface. For example, for a loudspeaker apparatus 200 with an oblong downstream surface, the surface area of the enclosure 210 is preferably no wider or taller than the downstream surface of the loudspeaker apparatus 200.

In an alternative example, the electrodynamic moving-coil mechanism of the low frequency transducer 300 described above is replaced by an isodynamic/planar mag-netic assembly. In an isodynamic/planar magnetic assembly, a cylindrical moving coil is replaced with one or more paths (segments) of conductive wires, mounted on to the radiating surface (diaphragm). These conductive wires are arranged within a magnetic field and in such a configuration that as a current flows through them, the radiating surface is sub-jected to uniform force in the same direction as for the moving coil equivalent system described above.

In a further alternative example, the electrodynamic mov-ing-coil mechanism of the low frequency transducer 300 described above is replaced by a stack or cantilever of piezoelectric elements, arranged in such a way to combine the typically small deflection of each element (typically around 0.1 mm) to create a deflection of similar magnitude to a typical electrodynamic low frequency transducer (typi-cally around 1 to 5 mm).

More generally, the low frequency unit 300 and the high frequency unit 400 may use any apparatus to generate, respectively, low frequency and high frequency sound sig-nals.

FIG. 3 shows a perspective view of the loudspeaker apparatus 200 in which the front (downstream) surface of the loudspeaker apparatus 200 can be seen in more detail. In particular, as shown in FIG. 3, a high frequency transducer 400 is mounted to the diaphragm 314 of the low frequency transducer 300 (FIG. 3 shows an example arrangement in which four high frequency transducers 400 are mounted to the low frequency transducer 300).

In the present example, a high frequency transducer 400 is mounted in an aperture 324 provided in the diaphragm 314 of the low frequency transducer.

As shown in FIG. 3, the diaphragm (radiating surface) 314 of the low frequency transducer comprises four aper-tures 324 in each of which a high frequency transducer 400 is mounted/located. For illustration purposes, FIG. 3 shows one 324 aperture as unfilled (top-right), two apertures with high frequency transducers 400 mounted therein (top-left and bottom-right), and a fourth aperture hidden beneath a supplementary radiating surface 420 (forming part of a secondary radiating member) of a high frequency transducer 400.

The apertures 324 are preferably distributed substantially uniformly across the diaphragm 314 (i.e. a substantially similar concentration of apertures 324 is maintained across all sections of the diaphragm 314). Further, the spacing between a pair of adjacent apertures 324 (and thus the centre points of adjacent high frequency transducers 400) is pref-erably substantially the same for each adjacent pair. The apertures 324 are preferably also positioned such that if a plurality of loudspeaker apparatuses 200 are positioned adjacent to one another the spacing between the adjacent apertures 324 of adjacent loudspeaker apparatuses 200 is substantially the same as the spacing of the adjacent aper-tures 324 within a loudspeaker apparatus 200. In the example illustrated in FIG. 3, the spacing between apertures remains substantially equal in two perpendicular directions (both perpendicular to the downstream axis 202)— typi-cally, these directions correspond to horizontal and vertical axes in use.

The high frequency transducers 400 are mounted into the apertures 324 in the low frequency transducer's radiating surface 314. The perimeter of the/each aperture 324 is preferably slightly recessed on the downstream (upper) surface of the diaphragm 314. The periphery of a high frequency transducer 400 may be mounted to the recessed perimeter of the aperture 324. The high frequency transducer may then be secured in place using a continuous ring of adhesive. Such a "recessed" arrangement may result in a loudspeaker apparatus 200 with a substantially flat (planar) downstream surface.

The high frequency transducers 400 when thus mounted preferably also form part of the low frequency radiating surface 314, as well as being able to radiate individually over the second frequency range.

In order to maintain good low frequency sensitivity of the loudspeaker apparatus, it is preferred that the mass of the high frequency transducers 400 is kept low. Thus, low weight high frequency transducers 400 are preferred, such as piezoelectric transducers, as opposed to heavier conven-tional moving coil transducers. An example structure of the high frequency transducer 400 is described in further detail below with reference to FIG. 5.

A person skilled in the art would appreciate that the/each high transducer 400 may be mounted to the diaphragm 314 of the low frequency transducer 300 in a number of alter-native ways. For example, the/each high transducer 400 may be mounted to a continuous (i.e. not comprising apertures) diaphragm 314 using an adhesive or stitching.

Figure 5:
FIG. 5 shows a perspective view of a second (high frequency) unit (transducer)

FIG. 5 shows a perspective view of a high frequency transducer 400.

In the present example, the high frequency transducer 400 makes use of the piezoelectric effect in order to propagate sound in a higher (second) frequency range. In other words, the high frequency transducer 400 is a piezoelectric trans-ducer. The high frequency transducer 400 comprises piezo-electric elements which make use of the piezoelectric effect to transform an electrical signal into vibration. Preferably, the high frequency transducer comprises a piezoelectric bimorph.

The piezoelectric high frequency transducer 400 com-prises a metal (e.g. brass) electrode 402—this is also referred to as the negative electrode 402. In order to form a piezoelectric bimorph, two piezoelectric elements (prefer-ably discs), e.g. made out of PZT (Lead Zirconate Titanate), are mounted to opposite faces of the negative electrode 402. The downstream (upper) piezoelectric element 404 is shown in FIG. 5. A number of alternative piezoelectric materials (materials for which their crystalline shape is altered by the presence of an electric field) may be used for the piezoelec-tric elements instead, such as Kynar® (PVDF, polyvi-nylidene fluoride).

The outer faces of the piezoelectric elements 404 are coated with a thin metallic layer, thereby forming two positive electrodes (the downstream (upper) positive elec-trode 406 is shown in FIG. 5) which are connected in parallel via a conductive (e.g. copper) wire 408. The resulting assembly is termed a piezoelectric bimorph.

In use, an electrical signal is applied to the positive electrodes 406, such that there is a potential difference between them and the negative electrode 402. As a result, a force is generated along the downstream axis 202, which deflects the high frequency transducer 400 surface maximally along the same axis. When the electrical signal is an alternating voltage, acoustic sound waves are generated by the resulting vibration of the assembly, which acts as the sound-radiating member (diaphragm) of the high frequency transducer 400.

The surface of the piezoelectric elements 404 and of the positive electrodes 406 is preferably planar. This may allow the sound propagated by the high frequency transducer 400 to have a high directionality.

The electrical connection to the positive electrodes 406 of the high frequency transducer 400 is preferably made using a loop of flexible wire 408, which projects through apertures in the loudspeaker apparatus to a terminal panel (the downstream end of the aperture 326 is shown in FIG. 3). In order to simplify construction, a common connection 206 (see FIG. 3) may be created between negative electrodes 402 of a plurality of high frequency transducers 400 mounted to the low frequency transducer 300, e.g. using two lengths of conductive wire.

FIG. 4 shows a perspective view of the loudspeaker apparatus 200 (with a number of components, such as the chassis members 322 or cylindrical parts 308, 310, not shown for illustrative purposes). As shown in FIG. 4, the common connection 206 may be attached to a further conductive wire 208 which passes through an aperture in the low frequency diaphragm 314 and down the outside (outer) face of the coil former 304, where it connects to a negative lead (supply) of the low frequency voice coil 302.

The negative electrode 402 of the piezoelectric bimorph (high frequency transducer) 400 preferably extends to form an annular perimeter of the transducer 400. The transducer 400 may then be directly mounted to the perimeter of an apertures 324 in the low frequency radiating surface 314 along the negative electrode 402.

Optionally, a secondary sound-radiating member is attached to the diaphragm (primary sound-radiating member) of the high frequency transducer 400 which, in the present example, comprises the piezoelectric bimorph assembly as described above. The secondary sound-radiating member comprises a pair of supplementary radiating elements 420 attached to the piezoelectric element (disc) 404 at its maximal deflection point, (e.g. for a disc, at the centre of disc) in order to increase the mechanical coupling of this deflection to the medium (typically air), thereby increasing the transduction efficiency of electrical energy to acoustic waves. FIG. 3 shows one such downstream supplementary radiating element 420 in place, and three of these supplementary radiating elements removed for illustrative purposes so as to show the location of the high frequency transducers 400 and apertures 324.

The supplementary radiating element 420 is preferably made of felted paper pulp, homogeneous sheet materials such as engineering plastics (for example polycarbonate, PEEK or Kapton®), or woven fabrics such as carbon or aramid fibres. The surface of the supplementary radiating element 420 is preferably flat, but it may also be concave or convex. The radiating element 420 (and in particular its downstream surface) may have a number of different shapes. Preferably, the radiating element 420 has a tesselatable shape—i.e. a shape that allows forming a tessellation from a plurality of radiating elements 420, all of the same shape (e.g. square), or of various shapes that combine to form a tessellation (e.g. octagons and squares). More preferably the radiating element 420 has an equiangular polygon shape, yet more preferably a regular polygon shape (such as square or triangular). Each radiating element 420 having a tesselatable shape may allow a plurality of radiating elements 420 to form a tessellation across the surface of the diaphragm 314 of the low frequency transducer 300, so that the radiating surfaces (diaphragms) of the high frequency transducers 400 may substantially cover the whole of the diaphragm 314 of the low frequency transducer 300 without overlapping. In this way, the loudspeaker apparatus 200 may be provided with a substantially continuous downstream sound-radiating surface that propagates both low and high frequency sound.

A significant benefit of using the piezoelectric principle for the high frequency transducers 400 is that piezoelectric transducers 400 may be lighter than alternative forms of transducers. The mass of the high frequency transducer 400 assembly can therefore be greatly reduced compared to if, for example, the electrodynamic moving coil principle or electrostatic transducers were employed for the high frequency transducers 400, due to their comparatively high mass. The mass of the moving parts of the high frequency transducer 400 is preferably less than 5 grams, more preferably less than 3 grams. Preferably, the mass of the piezoelectric transducer element 404 is less than 3 grams, more preferably between 0.6 and 1.2 grams. The mass of the supplementary radiating element 420 is preferably less than 0.25 grams, more preferably in the region of 0.05 to 0.15 grams. In comparison a high frequency transducer (tweeter) of a similar radiating area, based on the electrodynamic moving-coil principle and using a light-weight neodymium-iron-boron magnet, may have a mass of at least 50 grams.

The moving parts of the high frequency transducer comprise: the piezoelectric elements 404, the positive electrodes 406 (which together act as the primary sound-radiating member), and optionally the supplementary radiating surface 420 (which acts as the secondary sound-radiating member).

The high frequency transducer 300 may operate over a frequency range of 1 kHz to above 20 kHz, and preferably over a frequency range of 4 kHz to above 20 kHz.

In an alternative example, a single piezoelectric element is used for the high frequency transducer 400 (rather than two elements forming a piezoelectric bimorph as described above). For example, the single piezoelectric element may be mounted to a diaphragm. When the element is excited with an alternating voltage, its diameter changes, which results in deflection of the diaphragm (and thus propagation of sound).

In the example loudspeaker apparatus 200 shown in FIGS. 2 to 4, a square (downstream) surface (also referred to as a "profile") is shown for both the larger low frequency transducer 300 diaphragm 314 and the radiating elements 420 (which act as the diaphragms in the preferred example described above) of the high frequency transducers 400.

Figures 6A, 6B, 6C:
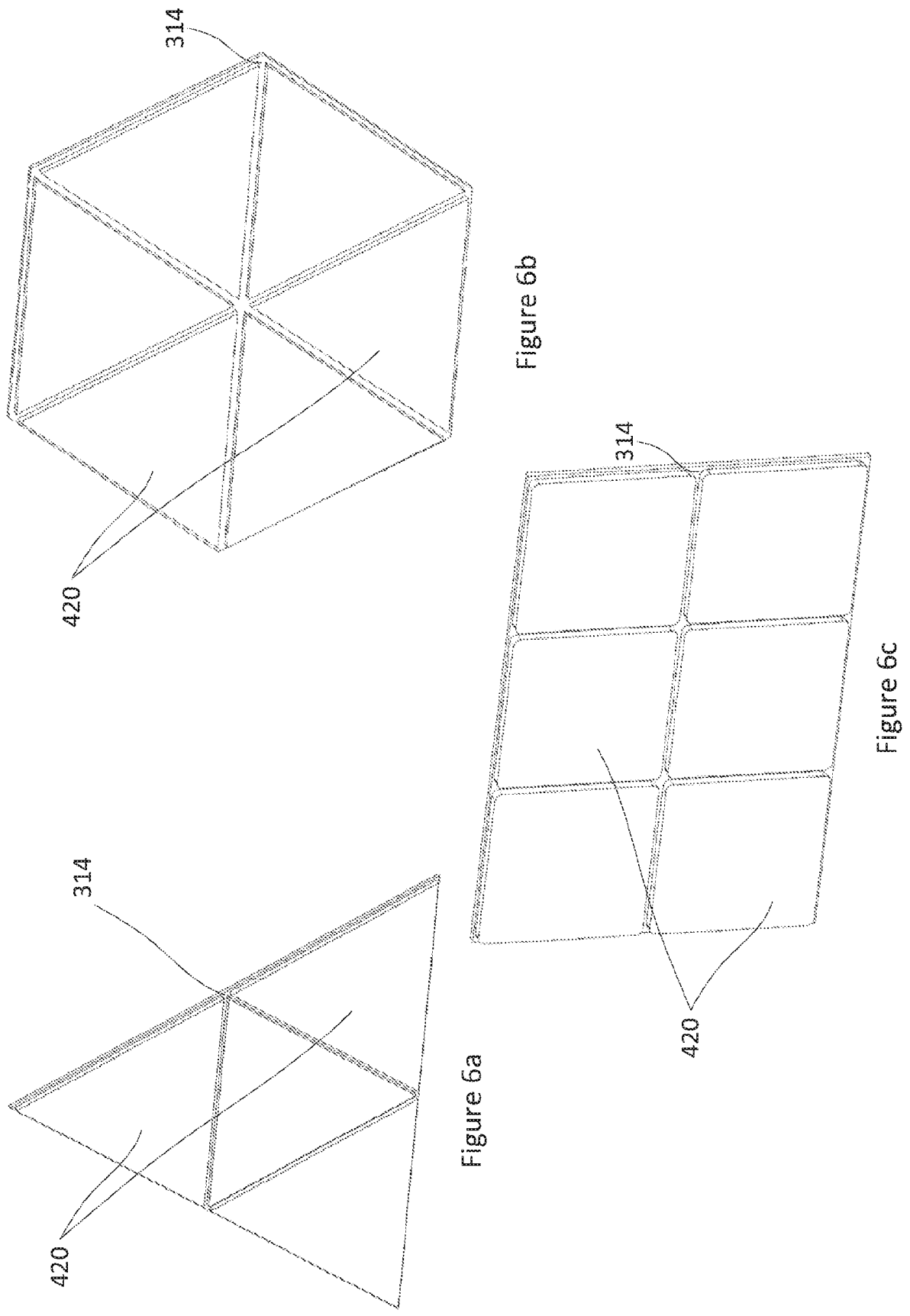
FIGS. 6a-6c show examples of the loudspeaker apparatus.

FIGS. 6a to 6c show further examples of the loudspeaker apparatus 200, in which the low frequency transducers 300 and high frequency transducers 400 have alternatively shaped diaphragms 314, 420.

FIG. 6a illustrates a low frequency transducer 300 with a diaphragm 314 with an equilateral triangular profile with four high frequency transducers 400 mounted thereto, each comprising a diaphragm (supplementary radiating surface) 420 with an equilateral triangle shaped profile.

FIG. 6*b* illustrates a low frequency transducer 300 with a diaphragm 314 with a regular hexagonal profile with six high frequency transducers 400 mounted thereto, each comprising a diaphragm (supplementary radiating surface) 420 with an equilateral triangle shaped profile.

FIG. 6*c* illustrates a low frequency transducer 300 with a diaphragm 314 with an oblong profile with six high frequency transducers 400 mounted thereto, each comprising a diaphragm 420 (supplementary radiating surface) with a square shaped profile.

As described above, the diaphragms 420 of the high frequency transducers 420 preferably have tessellatable shapes so that they may be arranged in a tessellation on the diaphragm 314 of the low frequency transducer 300. Preferably, the downstream surface of the loudspeaker apparatus 200 (and in particular its sound radiating surface (e.g. diaphragms 314, 420) which preferably substantially cover the downstream surface) also has a tessellatable shape as shown in FIGS. 2 to 4 (where the downstream surface is square), and FIGS. 6*a* to 6*c* (where the downstream surface has an equilateral triangle shape (FIG. 6*a*), hexagon shape (FIG. 6*b*) or oblong shape (FIG. 6*c*)). Providing loudspeaker apparatuses with tessellatable downstream surfaces may provide for loudspeakers apparatuses which can be arranged into arrays of loudspeaker units, to provide planar or line arrays of loudspeakers in which gaps between loudspeakers are minimised. In this way, a loudspeaker system 500 (described in further detail below) comprising a plurality of loudspeaker apparatuses 200 arranged in an array may be provided with a substantially continuous downstream surface. This may also allow for smaller centre to centre spacings of transducers 300, 400 (and in particular between high frequency transducers 400 so as to ensure a high $f_{alias}$ figure) across the loudspeaker array.

In the preferred example (shown in FIGS. 2 to 4), the low frequency diaphragm 314 when embodied by a square shape preferably has sides of length between 0.025 m to 0.5 m, more preferably between 0.05 m to 0.1 m. As the size of the low frequency diaphragm 314 is proportional to its mass, this also places a practical limit on the extent of its high frequency bandwidth. Thus, preferably, the extent of the low frequency bandwidth of the high frequency transducer(s) 400 provides adequate overlap between the frequency ranges covered by the low frequency transducer 300 and the high frequency transducer(s) 400.

For any given size of the loudspeaker apparatus 200, the extension of the low frequency bandwidth is determined in significant part by the mass of the moving parts of the entire loudspeaker apparatus 200, including the mass of the high frequency radiating elements (moving assembly) and supplementary radiating elements 420 (if present).

Preferably, in the preferred square-shape example, the loudspeaker apparatus 200 has sides approximately 0.05 m to 0.1 m in length, more preferably approximately 0.05 m. The mass of the moving parts of loudspeaker apparatus 200 is optimised such that the low frequency bandwidth is extended to a frequency of approximately 65 Hz when the rear (upstream) side of the low frequency transducer 300 is loaded by a given enclosed volume of air. For the preferred 0.05 m×0.05 m dimensions, preferably an enclosed volume of 0.5 to 1 litres (as defined by the hollow sealed box enclosure 210, shown e.g. in FIGS. 10 and 12) is used so that the low frequency transducer 300 may operate down to a frequency of 65 Hz. Alternatively, a smaller enclosed volume of 0.25 to 0.5 litres may be used, which may allow the low frequency transducer 300 to operate down to a frequency of 100 Hz. The bounds of the frequency bandwidth are preferably defined as the point where the acoustic output of the loudspeaker apparatus 200 is 3 decibels lower than the average output level of the loudspeaker apparatus 200 over its operating frequency range.

For improved performance, the mass of the moving parts of the high frequency transducer 400 may be used as part of this optimisation process. Given that the efficiency of a transducer turning electrical energy into acoustic (kinetic) energy is inversely proportional to the square of the mass of the moving parts of the transducer, a limit is placed on the amount of additional mass that can be added before the efficiency is compromised to that below a conventional moving coil low frequency transducer of the same radiating area and optimised to operate down to the same frequency. Preferably, a ratio of no more than 1:1 is established between the total mass of the moving parts of the high frequency transducers 400 and the moving parts of the low frequency transducer 300.

In the same preferred example (0.05 m×0.05 m downstream surface dimensions), four high frequency radiating elements are arranged as shown in FIG. 2 on the surface of the low frequency diaphragm 314, thus creating a centre-to-centre spacing between each high frequency transducer of 0.025 m, which yields a $f_{alias}$ of 6.9 kHz.

Figure 7B:
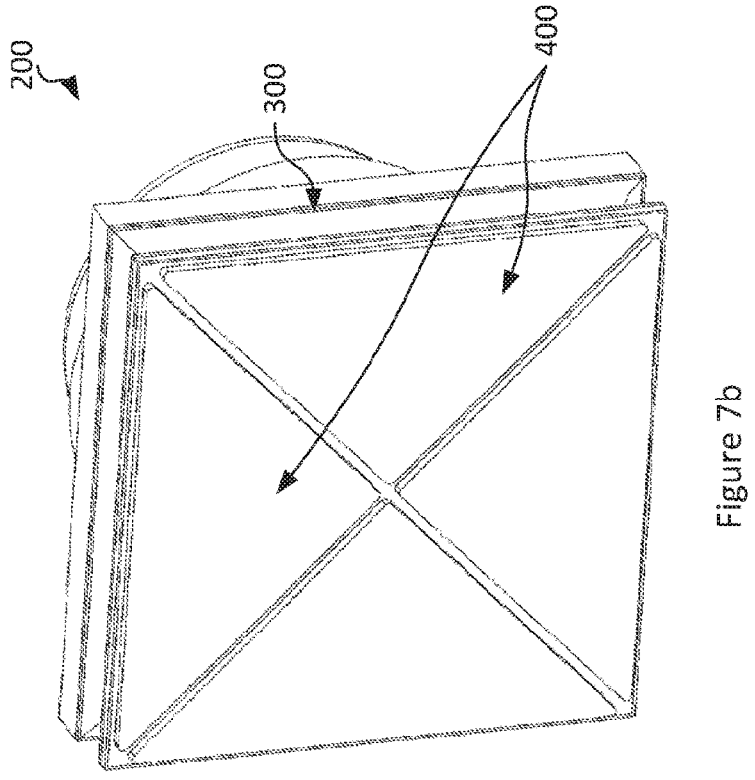
FIGS. 7a-7b show further examples of the loudspeaker apparatus.
Figure 7A:
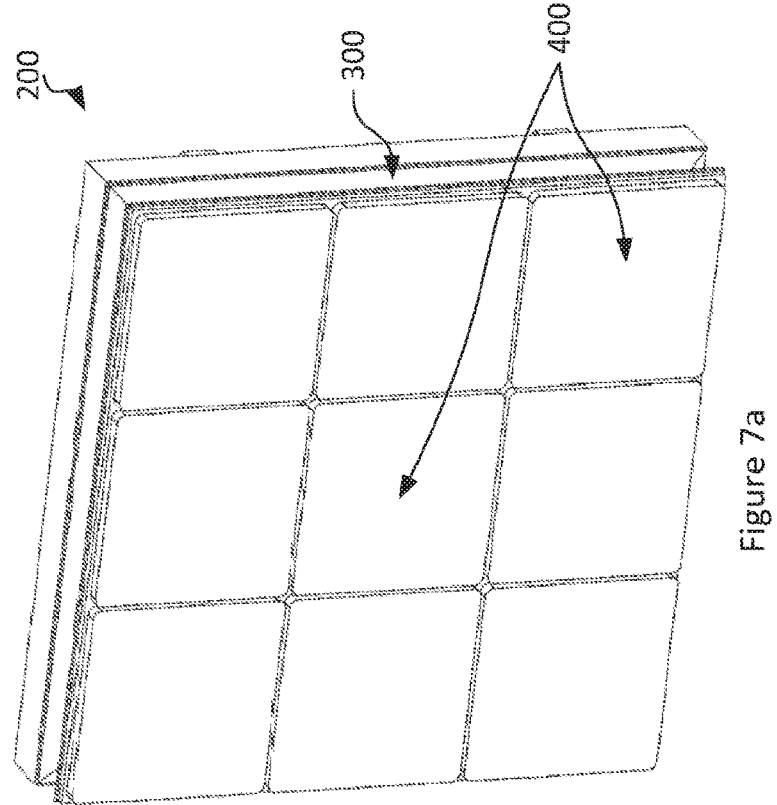
Figure 9:
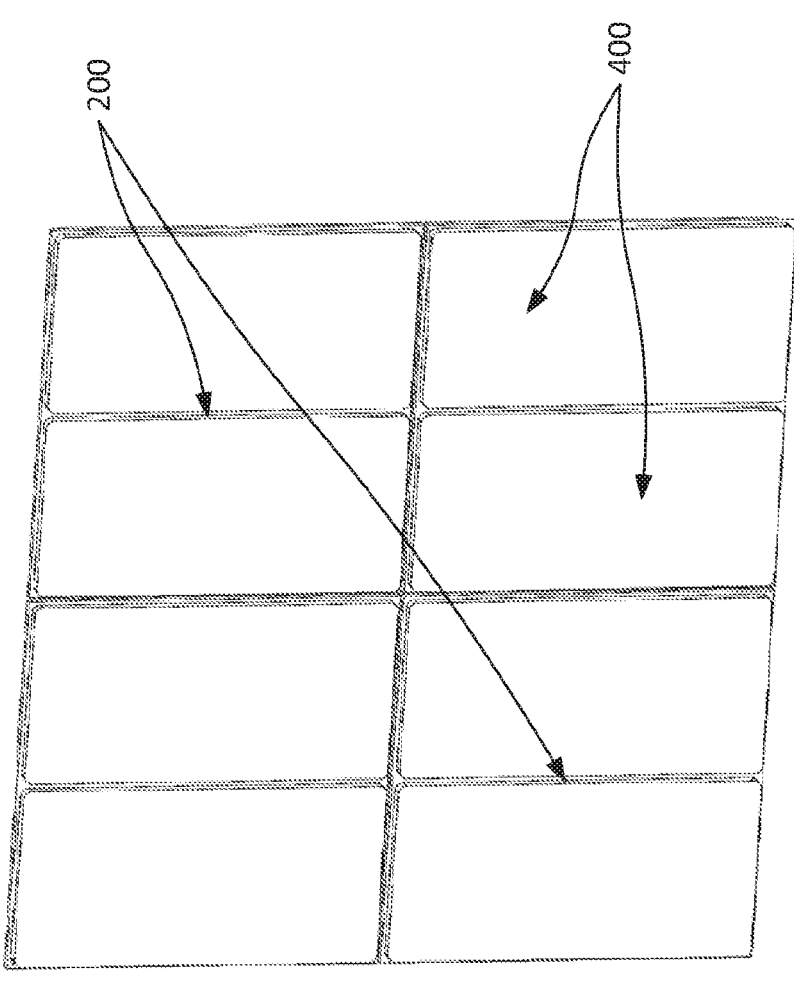
FIG. 9 shows a further example loudspeaker system.

FIGS. 7*a* and 7*b* show further examples of the loudspeaker apparatus 200. FIGS. 7*a* and 7*b* illustrate a number of different possible shapes of high frequency transducers 400 disposed on a square-shaped low frequency transducer 300. FIG. 9 shows a loudspeaker system 500 comprising four loudspeaker apparatuses 200, each with a yet different shape of high frequency transducers 400 disposed on a square-shaped low frequency transducer 300

FIG. 7*a* shows a larger example loudspeaker apparatus 200 employing a low frequency transducer 300 with a 0.075 m by 0.075 m downstream surface (diaphragm 314), mounted on which are nine high frequency transducers 400, each with a downstream surface of 0.025 by 0.025 m.

FIG. 7*b* shows an example loudspeaker apparatus with a square low frequency diaphragm 314 with dimensions of 0.05 m×0.05 m, where the high frequency diaphragms 420 are isosceles triangle shaped and meet at the centre of the low frequency diaphragm 314. Accordingly, a smaller (as compared to the preferred example described above) centre to centre spacing between high frequency transducers 400 of 0.0167 m is created, without increasing the number of high frequency transducers 400 or signal processing and amplification channels. This spacing (0.0167 m) yields a $f_{alias}$ of 10.3 kHz.

The invention also extends to high frequency transducers 400 (diaphragms 420) which, when arranged on a low frequency transducer 300, exhibit different centre to centre spacing in one direction (e.g. the X plane) than in a second perpendicular direction (e.g. the Y plane). FIG. 9 shows an example loudspeaker system 500 comprising an array of four loudspeaker apparatuses 200, each with square low frequency diaphragms 314, upon which high frequency transducers 400 with rectangular diaphragms 420 are located. Uniformity of centre to centre spacing along each direction is maintained, whilst being dissimilar in the first and second directions (e.g. in X and Y planes).

It should be appreciated that the present disclosure extends to loudspeaker apparatus 200 with any downstream surface shape, both tessellating (tessellatable) and non-tessellating (non-tessellatable). For example, the downstream surface may be circular, at the cost of a reduction in radiating surface area (per occupied surface area) when assembled into a non-tessellating linear or planar array of loudspeaker apparatuses 200.

In an alternative example, the loudspeaker apparatus 200 comprises a third unit arranged to propagate sound in a third frequency range that is higher than the second frequency range mounted to a sound-radiating member of the second unit. For example, one or more transducers, radiating in the mid frequency range (mid-range transducers), may be mounted on the low frequency diaphragm 300. One or more high frequency transducers 400 may then be mounted on the mid-range transducer(s), thus creating a loudspeaker apparatus with individually addressable transducer elements, operating over the low, mid and high frequency ranges.

Loudspeaker System

The loudspeaker apparatus 200 described above is particularly well suited to being arranged in an array of loudspeaker apparatuses (loudspeaker system) 500. Such arrays may be scalable to arbitrary size in one or more planes (e.g. in the horizontal and vertical planes), thus making the invention suitable for implementation of the Wave Field Synthesis technique as applied to linear and planar arrays (and/or any other technique that requires an array of loudspeaker apparatuses).

Figure 8A:
FIG. 8a shows an example loudspeaker system comprising a 2D 10×10 array of the loudspeaker apparatuses.
Figure 8A:
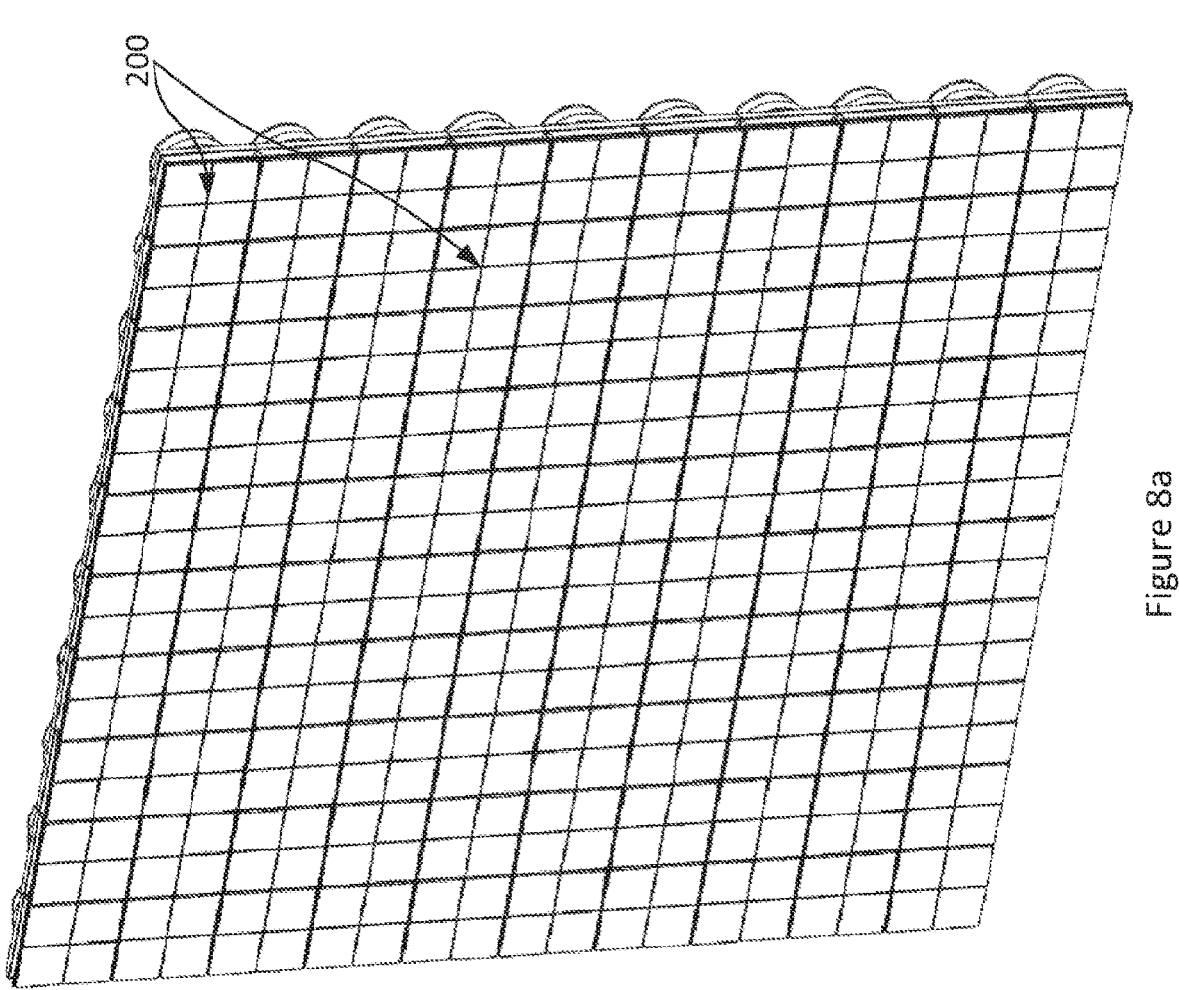
Figure 8B:
FIG. 8b shows an example loudspeaker system comprising a 2D 3×16 array of the loudspeaker apparatuses.
Figure 8B:
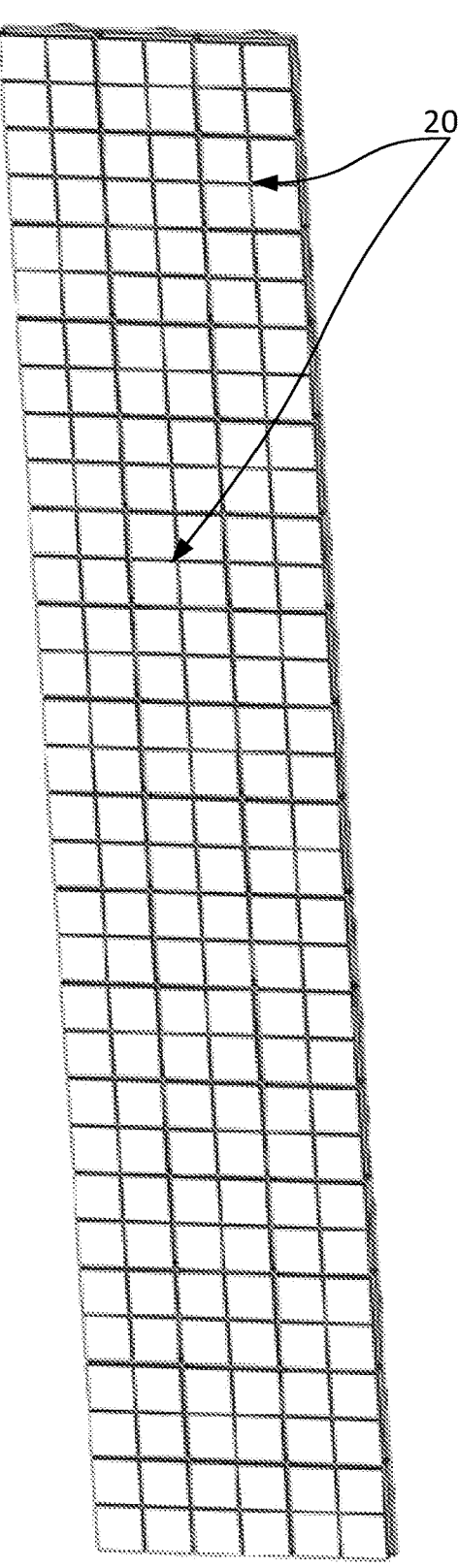

FIGS. 8a, 8b, and 9 show example loudspeaker systems 500, each comprising an array of loudspeaker apparatuses 200. FIG. 8a shows an example loudspeaker system 500 comprising a 2D 10×10 array of loudspeaker apparatuses 200. FIG. 8b shows an example loudspeaker system 500 (array 500 of loudspeaker apparatuses) comprising a 2D 3×16 array of loudspeaker apparatuses 200. Each loudspeaker apparatus 200 in FIGS. 8a and 8b comprises a single square low frequency transducer 300 with four square high frequency transducers 400 mounted thereto. FIG. 9 shows an example loudspeaker system 500 comprising a 2D 2×2 array of loudspeaker apparatuses 200. Each loudspeaker apparatus 200 in FIG. 9 comprises a single square low frequency transducer 300 with two oblong high frequency transducers 400 mounted thereto.

It should be appreciated that the loudspeaker system 500 may comprise loudspeaker apparatuses 200 in other shapes and/or other arrangements than those shown in FIGS. 8a, 8b and 9. For example, the loudspeaker apparatus 200 may be any of the loudspeaker apparatuses described with reference to FIGS. 6a to 6c, arranged in various configurations such as a curve, line, or triangle. As a further example, "square" loudspeaker apparatuses 200 (as described with reference to any FIGS. 8a, 8b) may be arranged to construct an array of similar dimensions as conventional "line array" systems currently used for sound reinforcement at many events. Such arrays are typically of up to 1.5 m wide and 10 m tall.

As shown in FIGS. 8a, 8b and 9, the downstream surface of the array 500 of loudspeaker apparatuses is preferably substantially continuous, more preferably wherein the loudspeaker apparatuses 200 are arranged in a tessellation. In this way a continuous, sound-emitting surface (which emits both high and low frequency sound without compromising the quality of either) may be provided. Further, loudspeaker apparatuses 200 are preferably constructed and arranged such that the centre to centre spacing between a pair of adjacent first transducers 300 (and/or between a pair of second transducers 400) is preferably substantially the same for each adjacent pair (e.g. for first transducers 300 with polygon-shaped diaphragms 314, a pair of transducers 300 whose diaphragms 314 share an edge, or, for transducers 300 with circle-shaped diaphragms 314, a pair of transducers 300 whose diaphragms' 314 perimeters touch (or almost do, as physical touching between diaphragms 314 may be undesirable)) across the array 500, in order to maintain a uniformly high $f_{alias}$ figure across the array 500. The horizontal and/or vertical centre to centre spacing between adjacent high frequency transducers 400 may be particularly important for concert or cinema applications (for an array 500 whose downstream direction is perpendicular to both the horizontal and vertical directions) due to the wide bandwidth of signals typically reproduced in these applications. Thus, the loudspeaker apparatuses 200 may be arranged such that the centre to centre spacing between a pair of first transducers 300 (and/or between a pair of second transducers 400) adjacent along the horizontal (first) direction may be substantially the same for each pair adjacent along the horizontal direction across the array (and likewise for a (second) vertical direction).

Figure 12:
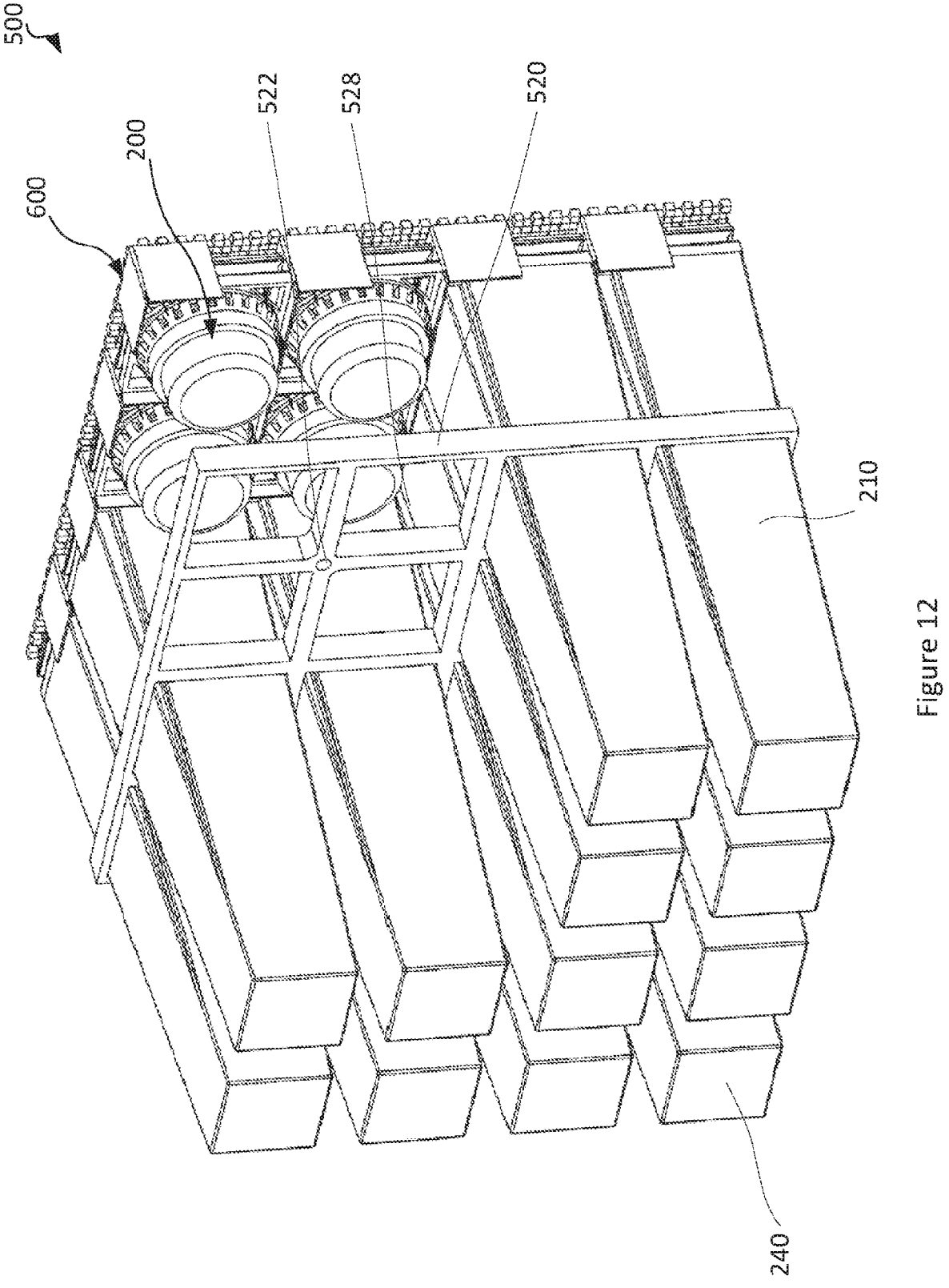
FIGS. 12-14 show loudspeaker systems and display panels mounted thereto.
Figure 14:
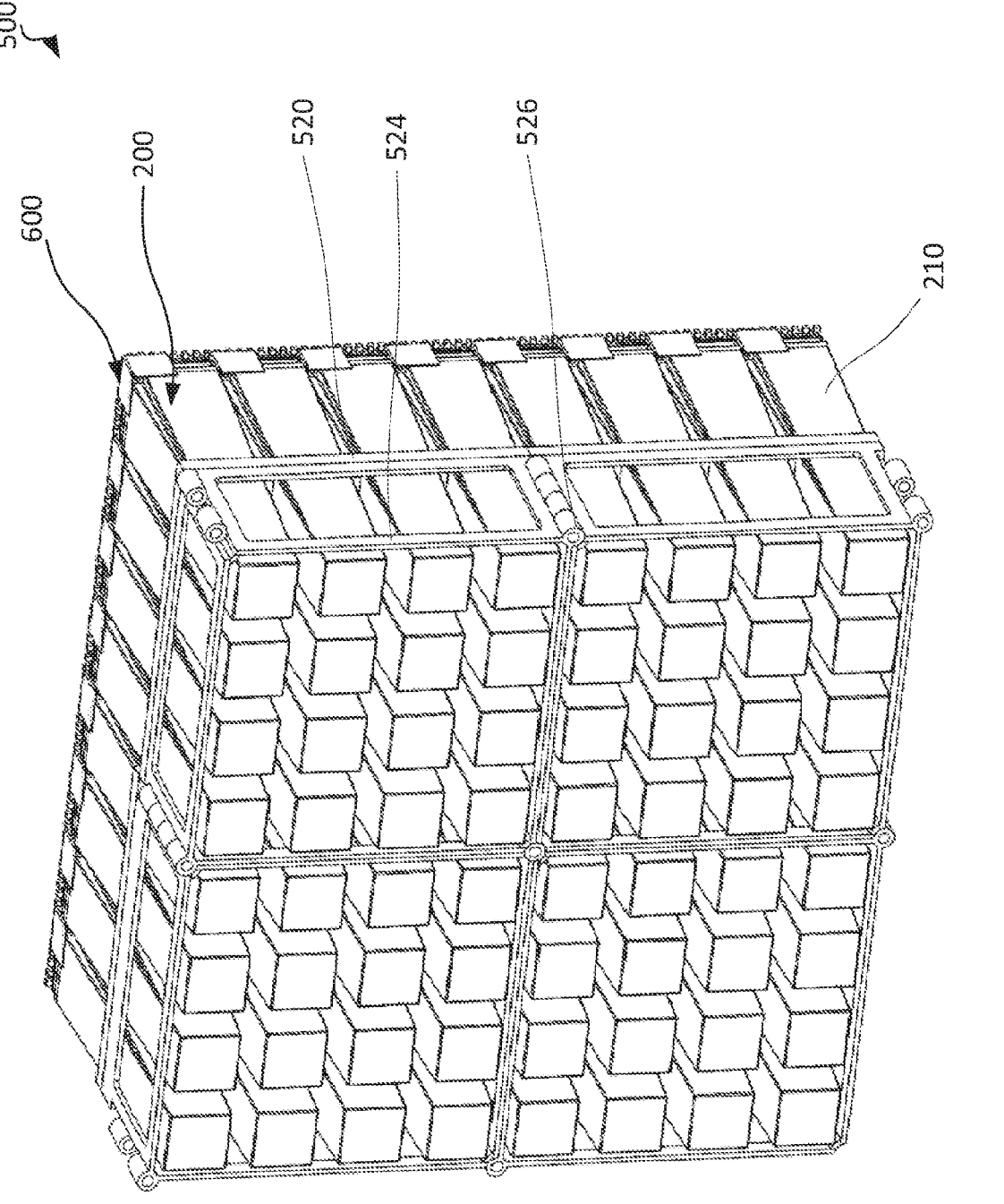

The loudspeaker system 500 may further comprise a support module 520. FIGS. 12 and 14 show further example loudspeaker systems 500 comprising a support module 520. FIG. 12 shows a loudspeaker system 500 comprising: a 4×4 array of loudspeaker apparatuses 200, each comprising an enclosure 210 (four of the enclosures 210 are not shown for illustrative purposes); display panels 600 (described in further detail below) mounted to each loudspeaker apparatus 200; and a support module 520. FIG. 14 shows four loudspeaker systems of FIG. 12 interlocked into an 8×8 loudspeaker array 500. FIGS. 12 and 14 show a combined audio and visual system comprising display panels 600, however it should be appreciated that the display panels 600 are an optional feature of the loudspeaker system 500.

The support module 520 is arranged to support the loudspeaker apparatuses 200 forming part of the loudspeaker array 500 and comprises apertures 528 for mounting the loudspeaker apparatuses 200 therein. In the example support module 520 structure the enclosure 210 of each loudspeaker apparatus is mounted in an aperture 528. Alternatively, other components (preferably not part of the moving parts) of the loudspeaker apparatus 200 may be mounted in the aperture 528, such as the chassis member 322. The support module 520 may be a matrix-like load-bearing panel configured to support the individual parts (loudspeaker apparatuses 200) of the array and to provide accurate location of each transducer 300, 400 in the directions perpendicular to the downstream axis (in typical use cases, in the horizontal and vertical planes). The loudspeaker apparatus 200 (and optionally display panel 600) electronics (such as signal processing, amplification and LED drive electronics) may be housed in an enclosure mounted on to the rear (upstream) surfaces 240 of the loudspeaker apparatus enclosures 210, in order to simplify and shorten the electrical connections to the acoustic (loudspeaker apparatus 200) and optionally visual (display panel 600) parts of the loudspeaker system 500.

For transportation purposes, the loudspeaker system 500 may comprise a plurality of support modules 520 arranged to interlock with one another, each support module 520 supporting a subset of the plurality of loudspeaker apparatuses 200 in the array 500. For example, the loudspeaker system 500 may be built in to interlocking panels (i.e. sets of support modules 520 and loudspeaker apparatuses 200 mounted therein) of no more than 1 m×1 m. For example, FIG. 14 shows four panels, each interlocked with its adjacent panels. In order to interlock panels, each support module 520 may comprise one or more fixing holes 522 (e.g. FIG. 12 shows one of four symmetrically located fixing holes 522) which act as attachment points to a further support frame 524 which interlocks with support frames 524 in neighbouring panels via pins inserted into mating "piano hinge" slots (channels) 526 in the corners of each frame 524. In this way rigid array 500 structures of arbitrary size may be assembled, whilst ensuring uniform spacing of both the loudspeaker apparatuses 200 and display panels 600.

The loudspeaker system 500 and/or the/each loudspeaker apparatus 200 may further comprise a control module, and/or a detection module.

Figure 15:
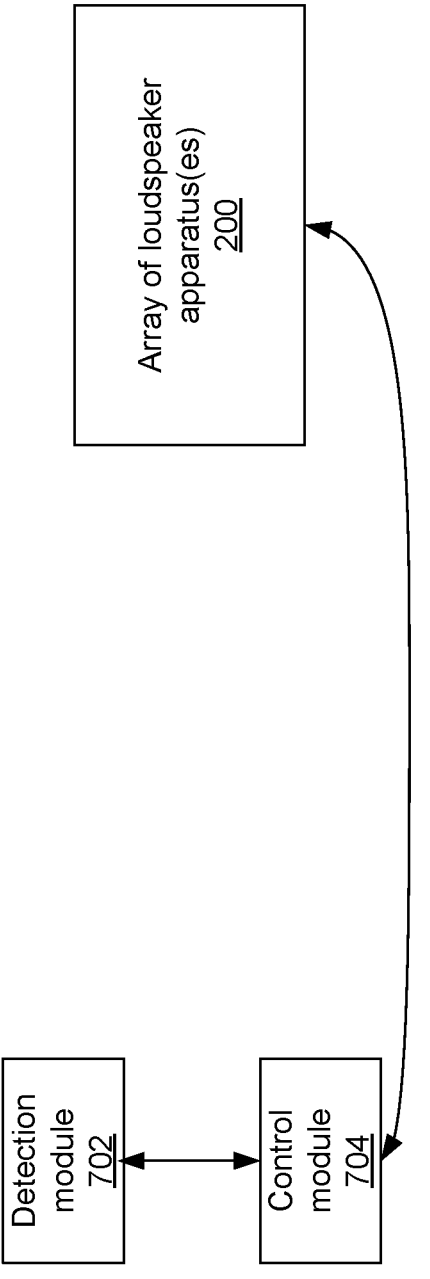
FIG. 15 shows a loudspeaker system.

FIG. 15 shows an example of a loudspeaker system 500 comprising loudspeaker apparatus(es) 200 (a plurality of loudspeaker apparatuses 200 arranged in an array 500, or alternatively a single loudspeaker apparatus 200) as described above, and a control module 704 that is in communication with the array of loudspeaker apparatus(es) 200.

The loudspeaker system 500 may further comprise a detection module 702 in communication with the control module 704.

The detection module 702 is arranged to detect (or locate), and optionally track, one or more objects downstream of the loudspeaker system 500. The detection module 702 may utilise a range of object detection/tracking techniques, such as radio frequency or infra-red based physical object tracking technology. The object(s) (e.g., a performer (performing artist), or a member or section of the audience during a concert) to be detected may be transmitted as an input to the detection module 702 from the control module 704. The detection module 702 may subsequently transmit data related to the detected/tracked object to the control module 704 which may adjust the synthesised sound filed to achieve a desired sound effect at the location of the object.

Preferably, each low frequency transducer 300 and each of high frequency transducer 400 in loudspeaker apparatus 200 or an array thereof are driven by individual audio channels. The audio channels are preferably signal processing and amplifier channels. This is typically a requisite for implementing WFS or an electronically adjustable dispersion pattern using the array 500. The control module 704 is responsible for controlling the transducers 300, 400 in order to synthesise a desired sound field.

As mentioned above, loudspeaker apparatus arrays adapted for WFS require individual amplification and signal processing channels for each of the transducers 300, 400 in the array. The control module 704 preferably performs signal processing for these transducers 300, 400 in the digital domain, due to this domain's inherent suitability to render the signal transfer functions required by the WFS technique, primarily time delay ("time delay" refers to a system's ability to emit an input signal defined as being at time zero, as an output at time zero plus an arbitrary increment).

In order to perform WFS signal processing, as well as controlling time delay across transducers 300, 400 in the array, the control module 704 is further responsible for adjusting overall signal amplitude and amplitude versus frequency for each individual transducer 300, 400 in an array 500. The primary requirement of the amplification of WFS systems over and above the methods commonly used for audio systems, is the multiplicity of channels given that each transducer 300, 400 in an array 500 must be individually addressable.

In order for a sound field incorporating x numbers of sound sources to be rendered, the signal processing is required to handle the same x numbers of input channels (signals). Each of these sources may dictate a materially different set of transfer functions for each of the transducers within the array. For a given WFS array (array being used for WFS), the control module 704 combines (mixes) the resultant output transfer functions for each input channel with the output transfer functions for the other input channels, in order to create the individual signals driving each amplifier channel and its associated transducer 300, 400 within the WFS array 500.

The control module 704 configures the transfer functions for each sound source being rendered by computing these transfer functions in line with the WFS mathematical requirements as known in the art. The control module 704 may then program the transfer functions of the signal processing channels, e.g. via a computer network. For example, by incorporating the VoIP (Voice over Internet Protocol) IEEE802.11 or AVB (Audio Video Bridging) IEEE802.1 standards, the same network may also be used to distribute digitally encoded input audio signals to the signal processing system of each transducer 300, 400.

The sound source(s) to be rendered by the WFS array 500 may be captured using a capture module (e.g. the original sound source can be captured using an array of microphones), or the sound source(s) may be created artificially in software. Either or a mix of both may then be used to derive transfer functions for each transducer 300, 400 in the WFS array 500, for each of the real or virtual sound sources, so as to create (synthesise) an overall WFS sound field.

Thus far the present invention has been described with particular reference to the implementation of loudspeaker arrays 500 suitable for Wave Field Synthesis (WFS). However, the invention is also well suited to the implementation of loudspeaker arrays 500 for other sound field synthesis techniques. For example, the invention is well suited for implementation of loudspeaker arrays 500 which are designed to have electronically adjustable dispersion patterns (directivity) in the vertical and/or the horizontal planes.

Similarly to WFS, such loudspeakers 200 benefit from a small centre to centre spacing of their high frequency transducers 400. The smaller the spacing, the higher the bandwidth over which it is possible to electronically adjust the dispersion pattern. The same equation governing $f_{alias}$ for WFS as shown earlier, also holds true in this case. Frequencies reproduced which lie above the $f_{alias}$ frequency, result in acoustic output outside of the coverage pattern of the loudspeaker 200. This output is confined to the frequency range above $f_{alias}$ and is referred to as lobes or lobing and is an undesired phenomenon.

In keeping with WFS, implementing electronically adjustable dispersion patterns requires that each transducer 300, 400 is driven by an individual signal processing and amplifier channel. Differing from WFS, the loudspeaker array 500 is typically driven by only one input signal and the signal processing as reproduced by each transducer 300, 400 is configured in such a way to affect the dispersion pattern of the whole array 500. The input signal can comprise any number of individual signals, mixed upstream of the input to the signal processing controlling the dispersion pattern of the loudspeaker array 500.

Electronic adjustment of the dispersion pattern is in the first instance achieved by applying incremental time delay to the input signal to the loudspeaker array 500, via the individual signal processing that can be applied to each transducer 300, 400. For example, the loudspeaker array (system) 500 shown in FIG. 8a may be configured in this manner, with the central column of transducers 300, 400 having no time delay applied and adjacent columns having incremental amounts of time delay applied. In a similar way to WFS, this creates multiple secondary wave fronts from each transducer 300, 400 column, which sum together in the far field to create a primary wave front. The curvature of that primary wave front is proportional to the increments in time delay between adjacent columns of transducers 300, 400. The curvature in turn is proportional to the width of the dispersion pattern of the sound emitted by the array 500.

Manipulating the time delay to each transducer 300, 400 column adjusts wave front curvature in the horizontal plane. Applying the same technique to rows instead, will adjust wave front curvature in the vertical plane instead. Combining adjustment of time delay of both rows and columns is also possible, in order to control sound dispersion in both the horizontal (or any other first direction) and vertical planes (or any other perpendicular second direction).

Similarly to WFS, the control module 704 configures the signal processing of the loudspeaker array 500, so as to define the array's dispersion pattern. Inputs to the control module 704 may comprise the required dispersion pattern in both the horizontal and vertical planes. Using techniques known in the art, the control module 704 subsequently computes the sound field from the array 500 and then applies numerical optimisation in order to iteratively derive a set of transfer functions that most closely meet the dispersion targets of the sound field as defined by the inputs to the control module 704.

The process of numerical optimisation may calculate the difference between the computed output of the array 500 (source) over surfaces such as the audience, auditorium and stage (receiver points) and the desired output (target function/goal) at those receiver points. The process may then adjust the properties of the source (for example the transfer functions of each of the audio channels) using an optimisation technique such as least squares regression, in order to iteratively arrive at a set of transfer functions that meet the desired goal within a defined margin of error (say 1 dB).

Alternatively, analytical methods can be used, via representing the receiver points as defined above as a three-dimensional matrix, which is then inverted to compute the transfer functions for each of the audio channels driving the loudspeaker array 500, which will yield the desired goal within a defined margin of error.

Electronic adjustment of the dispersion pattern may also be applied to audio-visual (or digital signage) applications, by means of the addition of a closely mounted, preferably coplanar, acoustically porous display panel 600 (e.g. a matrix of Light Emitting Diodes (LED's)) to each loudspeaker apparatus 200, so as to create a system capable of reproducing co-located video and audio content. The electronically variable acoustic dispersion pattern of such a system could then be used to project sound over an area or region, as defined in the control module 704.

This property may be used to target objects downstream of the loudspeaker apparatus 200, e.g. to target sections of an audience, or to create a sound beam to target individual sections of the audience.

The location of the targeted object may be determined by the detection module 702 and transmitted as an input to the control module 704, so as to direct the sound beam in real time. This technique may also be applied so as to create a null (quiet) zone within a wider sound field reproduced by the array of loudspeaker apparatuses (loudspeaker array). An example application of this method is creating this null zone at the location of a performing artist using a microphone (the tracked object), thus significantly reducing potential for feedback from the loudspeaker array 500.

The control module 704 may further synthesis a sound field to achieve wave field synthesis in a first direction, and an electronically adjustable dispersion pattern in a second direction, preferably perpendicular to the first direction. For example, using the "line" loudspeaker array 500 of FIG. 8*b*, the control module 704 may implement a combination of linear WFS in the horizontal plane, with an electronically-variable dispersion pattern in the vertical plane, thus yielding a highly realistic experience to the large audiences typically covered using line array systems, thus combining WFS and electronically adjustable dispersion pattern techniques.

Figure 16:
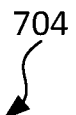
FIG. 16 shows an example of a computer device suitable for implementing a control module.
Figure 16:
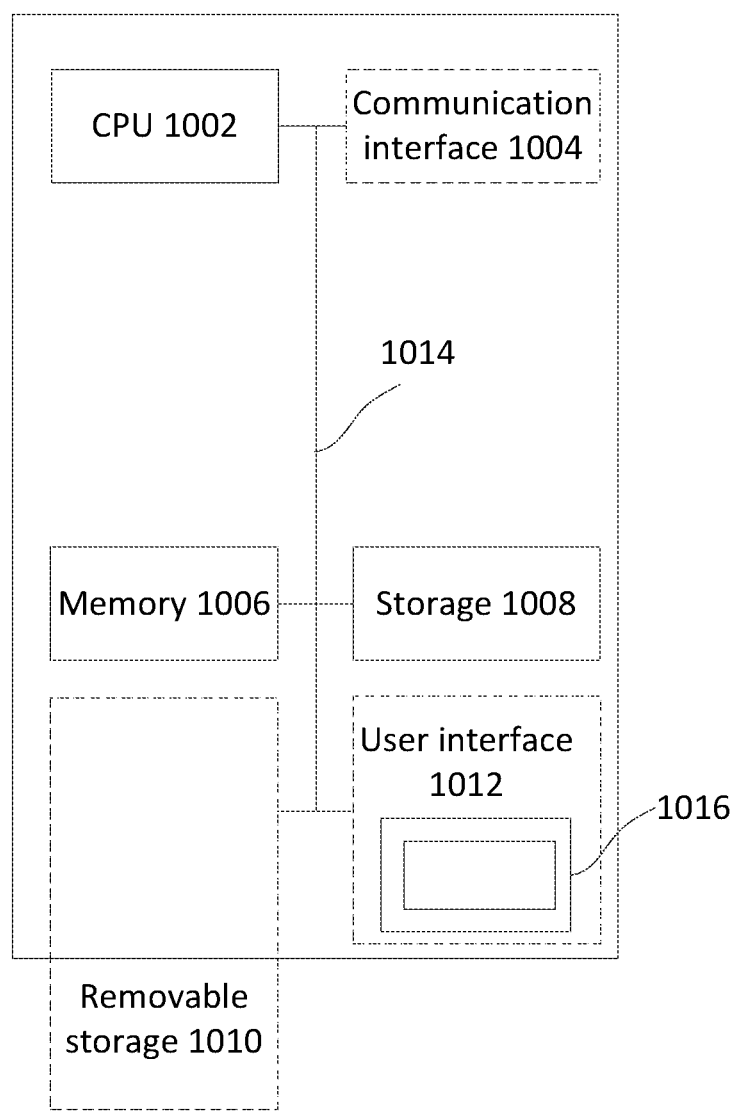

FIG. 16 shows an example of a computer device 1000 suitable for implementing the control module 704. The computer device 1000 comprises a processor in the form of a CPU 1002, a memory 1006, storage 1008, removable storage 1010 and optionally a user interface 1012 coupled to one another by a bus 1014. The user interface 1012 may comprise a display 1016 and an input/output device, which may be integrated into the display 1016 as a "touchscreen" (although it will be appreciated that other input/output devices, such as a keyboard and a mouse, may be used).

The computer device further comprises a communication interface 1004.

The CPU 1002 executes instructions, including instructions stored in the memory 1006, the storage 1008 and/or removable storage 1010.

The memory 1006 stores instructions and other information for use by the CPU 1002. The memory 1006 is the main memory of the computer device 1000. It usually comprises both Random Access Memory (RAM) and Read Only Memory (ROM).

The storage 1008 provides mass storage for the computer device 1000. In different implementations, the storage 1008 is an integral storage device in the form of a hard disk device, a flash memory or some other similar solid state memory device, or an array of such devices.

The removable storage 1010 provides auxiliary storage for the computer device 1000. In different implementations, the removable storage 1010 is a storage medium for a removable storage device, such as a portable flash drive or some other similar portable solid state memory device, or an array of such devices. In other embodiments, the removable storage 1010 is remote from the computer device 1000, and comprises a network storage device or a cloud-based storage device.

The communication interface 1004 is typically a transceiver suitable coupling the bus 1014 to a data network. The control module communicates with the detection module 702 and loudspeaker apparatus(es) 200 described with reference to FIG. 15 via the communication interface 1004.

The control module 704 is generally implemented as a computer program product, which is stored, at different stages, in any one of the memory 1006, storage device 1008, and removable storage 1010. The storage of the computer program product is non-transitory, except when instructions included in the computer program product are being executed by the CPU 1002, in which case the instructions are sometimes stored temporarily in the CPU 1002 or memory 1006. It should also be noted that the removable storage 1008 is removable from the computer device 1000, such that—in some embodiments—the computer program product may be held separately from the computer device 1000 from time to time.

Display Panel

A display panel may be mounted downstream of the loudspeaker apparatus 200 (and preferably of a loudspeaker array 500) as described above, in order to display moving video images. The Wave Field Synthesis technique may then be applied to render an audio scene, including motional elements, to be spatially co-located with the scene in the moving video image, so as to create a highly realistic and immersive experience for the observer(s).

In particular, when loudspeaker apparatuses 200 are arranged into planar arrays, a display panel for displaying visual information (e.g. a video image) in close proximity to and coplanar with the downstream surface of the array 500 may be provided. This may be achieved by providing an acoustically porous display surface (e.g. matrix of light emitting diodes (LED's)), supported by one or more mounting members which project through the planar array 600 in such a way that the array's acoustically radiating surface (in particular diaphragms 314 and 420) and f—alms figure are substantially unperturbed.

Figure 11:
FIG. 11 shows a display panel.

FIG. 11 shows an example display panel 600 when not mounted to a loudspeaker apparatus. FIGS. 10, 12, 13, 14 show the display panel 600 (or a plurality thereof) in use, when mounted to a loudspeaker apparatus 200.

The display panel 200 comprises a display surface 620 for displaying visual information, and a mounting member 610 extending from the surface 620, configured for mounting the surface 620 to a loudspeaker apparatus 200.

The display surface 620 is acoustically porous (i.e. a substantial proportion of its surface area, preferably at least 10%, freely transmits sound (i.e. does not reflect or absorb it)). In order to both display information and remain acoustically porous, the display surface 620 may comprise a plurality of acoustically porous elements 624 (e.g. apertures) and a plurality of display elements 622 (e.g. light emitting diodes) distributed substantially uniformly across the surface 620.

Preferential dimensions for mounting the display elements 622 in front of the loudspeaker apparatus 200 relate to the non-occluded area between the display surface 620 and the downstream surface of the loudspeaker apparatus 200, through which the transducers 300, 400 can radiate. For maximum sound wave transmission through the display surface 620, the percentage ratio of open to occluded area is preferably in the range of 40 to 70%, with a higher percentage allowing the most transmission. FIG. 10 shows an example where the display elements (in this example, LEDs) 622 are arranged in a chessboard pattern, with a 50% open (non-occluded) area comprised of apertures 624. Other example display element 622/acoustically porous element 624 patterns include interchanging lines (e.g. vertical or horizontal lines) of acoustically porous elements and display elements. Alternatively, to optimise for display quality and to improve the quality of the displayed information, a ratio of 10 to 40% non-occluded area may be used at the penalty of reduced sound wave transmission.

The display surface 620 may be a light emitting surface (e.g. a Light Emitting Diode (LED) display or a Liquid Crystal Display (LCD)), or a light reflecting surface (e.g. a projection screen). In the example shown in FIGS. 10 to 14, the display surface 620 is a light emitting surface, comprising a plurality of light sources in the form of LEDs 622 arranged in an array.

The display surface 600 is mounted to a loudspeaker apparatus 200 via a mounting member 610. In order to maintain the spacing between adjacent loudspeaker apparatuses 200 in an array 500 and hence a uniform f—alms figure, the mounting member preferably has a small cross-sectional area in the plane perpendicular to the downstream axis 202 (as shown in FIG. 11) so that it does not substantially increase the spacing between loudspeaker apparatuses 200. The mounting member 610 may have a blade-like (angle-shaped) structure configured for mounting the display surface 620 to two sides adjacent to a corner edge of the loudspeaker apparatus 200. For improved mounting reliability, a plurality of mounting members 610 may be used to mount the display surface 620 to the loudspeaker apparatus (e.g. FIGS. 10 to 14 show display panels 600 comprising two mounting members 610 configured for mounting to two corners of the loudspeaker apparatus 200).

The mounting member 610 may further provide for routing 612 of the electrical signals to drive the display surface 620 (e.g. LED's).

Figure 13:
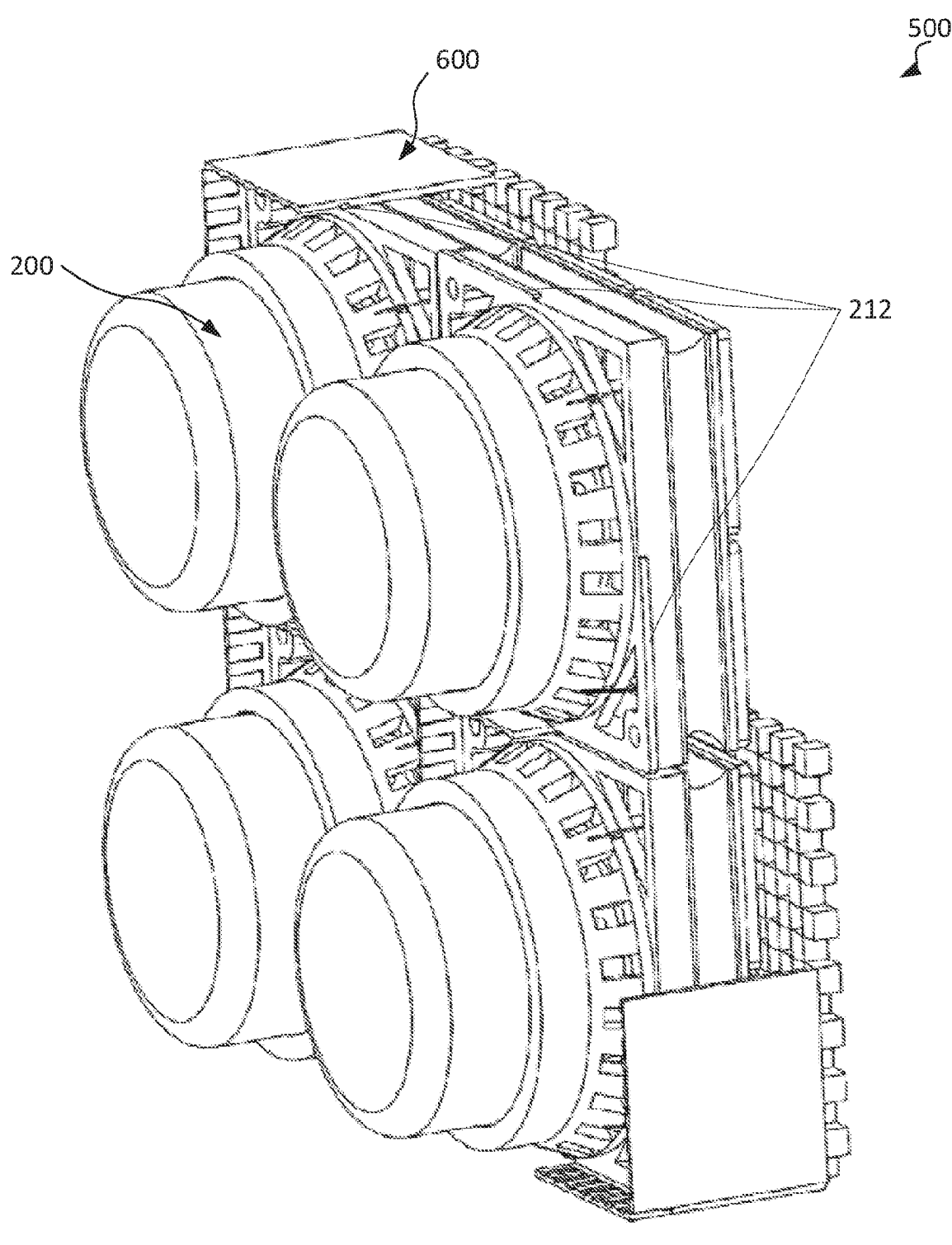

FIG. 13 shows an example loudspeaker system 500 comprising display panels 600 mounted to the loudspeaker apparatuses 200 (for illustrative purposes, one display panel 600 is not shown). As shown in FIGS. 11 and 13, the mounting member 610 may further comprise a female (or male) mating element 614 configured to mate with a male (or female) mating element 212 on the loudspeaker apparatus 200 (preferably on its chassis). This may improve the durability of the mounting as well as accurately set the distance between the display surface 620 and the radiating downstream surface 314, 420 of the loudspeaker apparatus 200, to ensure adequate clearance of said surface when it is vibrating during operation.

In use, the display surface 620 is preferably arranged downstream of the loudspeaker apparatus 200, more preferably substantially perpendicularly to the downstream axis 202 of the loudspeaker apparatus 200 (as shown in FIGS. 10, 12, 13, and 14).

The display panel 600 may be larger or smaller than the downstream surface of the loudspeaker apparatus 200, though preferably it is of the same surface area.

Alternative Examples and Embodiments

A person skilled in the art will appreciate that many different combinations of embodiments and examples described with reference to FIGS. 1 to 16 may be used alone unmodified or in combination with each other.

The described examples of the invention are only examples of how the invention may be implemented. Modifications, variations and changes to the described examples will occur to those having appropriate skills and knowledge. These modifications, variations and changes may be made without departure from the scope of the claims.

For example, whilst linear and especially planar arrays of loudspeaker apparatuses have been discussed, the invention can also be used as part of a surface of arbitrary shape, such as but not confined to, cylindrical or part thereof and spherical, or part thereof. For example, a spherical shape (or part thereof) may be achieved using low frequency transducers (with high frequency transducers mounted thereon) in shapes of regular pentagons and hexagons arranged in a honeycomb pattern.

The invention claimed is:

1. A loudspeaker apparatus comprising:
   a first sound-radiating unit arranged to propagate sound in a first frequency range, the first sound-radiating unit comprising a sound-radiating member; and
   a plurality of second sound-radiating units arranged to propagate sound in a second frequency range that is higher than the first frequency range, each second sound-radiating unit comprising a sound-radiating member;
   wherein each second sound-radiating unit is mounted on the sound-radiating member of the first sound-radiating unit;

wherein the sound-radiating members of the second units cover at least 80% of the sound-radiating member of the first unit; and wherein the first sound-radiating unit and the plurality of second sound-radiating units are driven by separate audio channels and/or the sound-radiating member of the first sound-radiating unit is planar.

2. A loudspeaker apparatus according to claim 1, wherein the sound-radiating member of the first sound-radiating unit comprises an aperture for mounting at least one second sound-radiating unit therein; wherein the at least one second sound-radiating unit is mounted to the perimeter of the aperture.

3. A loudspeaker apparatus according to claim 1, wherein each audio channel is an amplifier and signal processing channel; and/or wherein the apparatus is adapted to apply time delay to one or more of the audio channels; and/or wherein at least on of second sound-radiating units comprises a piezoelectric element arranged to propagate sound in the second frequency range.

4. A loudspeaker apparatus according to claim 1, wherein at least one of the second sound-radiating units comprises a planar sound-radiating member and/or wherein the sound-radiating member of at least one of the second sound-radiating units is positioned downstream of the sound-radiating member of the first sound-radiating unit.

5. A loudspeaker apparatus according to claim 1, wherein the sound-radiating member of at least one of the second sound-radiating units comprises a primary sound-radiating member arranged to deflect in use, and a secondary sound-radiating member attached to the primary sound-radiating member at its maximal deflection point.

6. A loudspeaker apparatus according to claim 1, wherein the first sound-radiating unit and each second sound-radiating unit are driven by separate audio channels.

7. A loudspeaker apparatus according to claim 1, comprising at least two pairs of adjacent second sound-radiating units, wherein the centre to centre spacing between a pair of adjacent second sound-radiating units is substantially the same for each adjacent pair.

8. A loudspeaker apparatus according to claim 1, wherein the summed downstream surface area of the sound-radiating members of the second units is substantially the same as the downstream surface area of the sound-radiating member of the first unit; and/or each sound-radiating member of a second unit has a tesselatable shape.

9. A loudspeaker apparatus according to claim 1, wherein the summed mass of the moving parts of the second sound-radiating units is less or equal to the mass of the moving parts of the first sound-radiating unit.

10. A loudspeaker apparatus according to claim 1, wherein the sound-radiating member of the first sound-radiating unit substantially covers the downstream surface of the loudspeaker apparatus.

11. A loudspeaker apparatus according to claim 1, wherein the sound-radiating member of the first sound-radiating unit has a tesselatable shape.

12. A loudspeaker apparatus according to claim 1, further comprising an enclosure arranged at the upstream side of the first sound-radiating unit and/or a third sound-radiating unit arranged to propagate sound in a third frequency range that is higher than the second frequency range mounted to a sound-radiating member of at least one of the second sound-radiating units.

13. A loudspeaker system comprising a plurality of loudspeaker apparatuses arranged in an array, each apparatus comprising:

a first sound-radiating unit arranged to propagate sound in a first frequency range, the first sound-radiating unit comprising a sound-radiating member; and a plurality of second sound-radiating units arranged to propagate sound in a second frequency range that is higher than the first frequency range, each second sound-radiating unit comprising a sound-radiating member;

wherein each second sound-radiating unit is mounted on the sound-radiating member of the first sound-radiating unit; and wherein the sound-radiating members of the second units cover at least 80% of the sound-radiating member of the first unit.

14. A loudspeaker system according to claim 13, comprising: at least two pairs of adjacent first sound-radiating units, wherein the centre to centre spacing between a pair of adjacent first sound-radiating units is substantially the same for each adjacent pair across the array; and/or at least two pairs of adjacent second sound-radiating units, wherein the centre to centre spacing between a pair of adjacent second sound-radiating units is substantially the same for each adjacent pair across the array, and/or wherein the sound-radiating member of each first sound-radiating unit is supported by a suspension member arranged to prevent contact between sound-radiating members of adjacent loudspeaker apparatuses.

15. A loudspeaker system according to claim 13, further comprising a support module arranged to support at least a subset of the loudspeaker apparatuses, the support module comprising apertures for mounting loudspeaker apparatuses therein.

16. A loudspeaker system according to claim 13, further comprising a control module arranged to control the first and second sound-radiating units across the array in order to synthesise a sound field.

17. A loudspeaker system according to claim 13, configured for implementing one or more of: wave field synthesis in one or more directions; an electronically adjustable dispersion pattern in one or more directions; and/or wave field synthesis in a first direction, and an electronically adjustable dispersion pattern in a second direction.

18. A kit of parts for a loudspeaker apparatus, comprising:

a first sound-radiating unit arranged to propagate sound in a first frequency range, the first sound-radiating unit comprising a sound-radiating member; and a plurality of second sound-radiating units arranged to propagate sound in a second frequency range that is higher than the first frequency range, each second sound-radiating unit comprising a sound-radiating member;

wherein each second sound-radiating unit is adapted to be mounted on the sound-radiating member of the first sound-radiating unit;

wherein the sound-radiating members of the second units are arranged to cover at least 80% of the sound-radiating member of the first unit; and wherein the first sound-radiating unit and the second sound-radiating units are adapted to be driven by separate audio channels and/or the sound-radiating member of the first sound-radiating unit is planar.

19. A loudspeaker apparatus according to claim 1, wherein in addition to propagating sound in the second frequency range, at least one second sound-radiating unit radiates in unison with the first sound-radiating unit thereby propagating sound in the first frequency range.

20. A loudspeaker apparatus according to claim 1, wherein at least one second sound-radiating unit comprises a plurality of piezoelectric elements arranged to form a piezoelectric bimorph.

\*    \*    \*    \*    \*